US012803141B2

(12) United States Patent
Acar et al.

(10) Patent No.: US 12,803,141 B2
(45) Date of Patent: Nov. 17, 2026

(54) ADJUSTABLE POWER SPLITTER/COMBINER

(71) Applicant: NXP B.V., Eindhoven (NL)

(72) Inventors: Mustafa Acar, Eindhoven (NL); Jasper Pijl-Peeters, Eindhoven (NL); Xin Yang, Eindhoven (NL); Danny Wayling Chang, Utrecht (NL); Gian Hoogzaad, Mook (NL)

(73) Assignee: NXP B.V., Eindhoven (NL)

(*) Notice: Subject to any disclaimer, the term of this patent is extended or adjusted under 35 U.S.C. 154(b) by 116 days.

(21) Appl. No.: 18/886,168

(22) Filed: Sep. 16, 2024

(65) Prior Publication Data

US 2026/0081332 A1 Mar. 19, 2026

(51) Int. Cl.

*H01P 1/18* (2006.01)
*H01P 5/12* (2006.01)
*H03H 7/18* (2006.01)
*H03H 7/30* (2006.01)
*H03H 7/38* (2006.01)
*H03H 11/28* (2006.01)

(52) U.S. Cl.

CPC ................ *H01P 1/184* (2013.01); *H01P 5/12* (2013.01); *H03H 7/18* (2013.01); *H03H 7/30* (2013.01); *H03H 7/38* (2013.01); *H03H 11/28* (2013.01); *H03D 2200/0005* (2013.01)

(58) Field of Classification Search

CPC .. H01P 1/184; H01P 5/12; H03H 7/18; H03H 7/30; H03H 7/38; H03H 11/28; H03D 2200/0005

USPC ............................ 333/26, 124, 156; 343/860

See application file for complete search history.

(56) References Cited

U.S. PATENT DOCUMENTS

| | | | | |
|---|---|---|---|---|
| 5,469,129 A | 11/1995 | Dydyk | | |
| 6,356,149 B1 * | 3/2002 | Stengel | ................ | H03F 1/0288 333/139 |

(Continued)

FOREIGN PATENT DOCUMENTS

| | | |
|---|---|---|
| CN | 105244591 A | 1/2016 |
| CN | 111326839 A | 6/2020 |
| GB | 2604220 A | 10/2023 |

OTHER PUBLICATIONS

Camarchia, V. et al., The Doherty Power Amplifier: Review of Recent Solutions and Trends.â IEEE transactions on microwave theory and techniques, pp. 559-571. (Year: 2015).*

(Continued)

*Primary Examiner* — Andrea Lindgren Baltzell
*Assistant Examiner* — Victor Cole

(57) ABSTRACT

A splitter/combiner having a first port, a second port, and a third port includes a first transmission line coupled between the first port and the second port, a second transmission line coupled between the first port and the third port, a resistor coupled between the second port and the third port, and first and second capacitors each having a first terminal and a second terminal, the first terminal of the first capacitor coupled to the second port, the first terminal of the second capacitor coupled to the third port, the second terminal of each of the first and second capacitors coupled to a common node. At least one of the first capacitor, second capacitor, first transmission line, and second transmission line is adjustable during operation for varying the electrical properties of the splitter/combiner.

19 Claims, 11 Drawing Sheets

(56) References Cited

U.S. PATENT DOCUMENTS

| | | | | |
|---|---|---|---|---|
| 8,514,007 | B1 | 8/2013 | Ahmed et al. | |
| 8,760,244 | B2 | 6/2014 | Kawai et al. | |
| 8,988,166 | B2 | 3/2015 | Elad et al. | |
| 9,166,561 | B1 | 10/2015 | Furino, Jr. | |
| 9,225,291 | B2 | 12/2015 | Ahmed et al. | |
| 9,647,611 | B1 | 5/2017 | Embar et al. | |
| 9,712,119 | B2 | 7/2017 | Datta et al. | |
| 10,742,176 | B2 | 8/2020 | Suravarapu et al. | |
| 2011/0006859 | A1* | 1/2011 | Cisco | H01P 9/00 333/164 |
| 2011/0204493 | A1 | 8/2011 | Chen et al. | |
| 2012/0102444 | A1* | 4/2012 | Ding | H01P 1/15 327/427 |
| 2014/0312986 | A1 | 10/2014 | Edelstein et al. | |
| 2016/0329880 | A1 | 11/2016 | Gao et al. | |
| 2019/0052493 | A1 | 2/2019 | Valdes Garcia et al. | |
| 2022/0216582 | A1* | 7/2022 | Golat | H01P 5/16 |
| 2023/0083719 | A1 | 3/2023 | Tesson | |
| 2024/0072769 | A1* | 2/2024 | Mantha | H01P 5/12 |

OTHER PUBLICATIONS

Lourandakis et al.: "A tunable and reduced size power divider using ferroelectric thin-film varactors," 2008 IEEE MTT-S International Microwave Symposium Digest, Atlanta, GA, USA, 2008, pp. 967-970.

Lourandakis et al.: "Circuit Agility", IEEE Microwave Magazine, IEEEService vol. 13, No. 1, Jan. 1, 2012, pp. 111-121.

F Torres et al.: "A novel tunable impedance transmission line for mm-waves applications"; 2015 IEEE 13th International New Circuits and Systems Conference (NEWCAS); Conference Location: Grenoble, France; Date of Conference: Jun. 7-10, 2015; 4 pages.

Guizan et al.: "Switched shield mm-wave tunable slow wave CPW in FinFET CMOS technology"; 2022 17th European Microwave Integrated Circuits Conference (EuMIC); Conference Location: Milan, Italy; Date of Conference: Sep. 26-27, 2022; 4 pages.

Laleh Rabieirad et al.: "Reconfigurable CMOS Tuners for Software-Defined Radio", IEEE Transactions on Microwave Theory and Techniques, IEEE, USA, vol. 57, No. 11, Nov. 1, 2009, pp. 2768-2774.

Microwaves 101: "Slow-Wave Structures"; 2024; 6 pages, downloaded on Mar. 12, 2024 from https://www.microwaves101.com/encyclopedias/slowwavestructures.

V Bhana et al.: "A frequency agile switched delay line slow-wave BiCMOS filter"; 2013 23rd International Conference Radioelektronika (Radioelektronika); Conference Location: Pardubice, Czech Republic; Date of Conference: Apr. 16-17, 2013; 5 pages.

Hazeri, Ali Reza, "An ultra wideband Wilkinson power divider", International Journal of Electronics, vol. 99, No. 4, Apr. 2012, pp. 575-584.

Omi, Asif I., et al; "A Novel Analytical Design Technique for a Wideband Wilkinson Power Divider Using Dual-Band Topology", Sensors 2o21, 21, 6330. https://doi.org/10.3390/s21196330, 19 pages.

EP non provisional application No. EPEP24386110.1 filed on Sep. 13, 2024, not yet published, 39 pages.

* cited by examiner

ADJUSTABLE POWER SPLITTER/COMBINER

TECHNICAL FIELD

This disclosure is directed generally to RF (radio frequency) and microwave circuits, devices, and methods, and more particularly to techniques involving adjustable power splitters and combiners.

BACKGROUND

Power splitters and combiners are common features found in many RF and microwave applications. A typical splitter/combiner has a first port, a second port, and a third port. In some types of splitters/combiners, a first quarter-wave transformer is electrically coupled in line between the first port and the second port, and a second quarter-wave transformer is electrically coupled in line between the first port and the third port. The quarter-wave transformers are typically realized using transmission lines. In some arrangements, an isolation resistor is electrically coupled between the second port and the third port.

When driven with an input signal applied to the first port, a splitter/combiner circuit acts as a splitter, dividing the power of the input signal between output signals provided at the second and third ports. The division may be equal or unequal, based on the design of the circuit and on the loads connected to the ports. When driven with respective input signals at the second and third ports, the circuit acts as a combiner, adding together the input signals to produce an output signal at the first port. The output signal provides a sum of the input signals.

BRIEF DESCRIPTION OF THE SEVERAL VIEWS OF THE DRAWINGS

The foregoing and other features and advantages will be apparent from the following description of particular embodiments, as illustrated in the accompanying drawings, in which like reference characters refer to the same or similar parts throughout the different views. The drawings are not necessarily to scale, emphasis instead being placed upon illustrating the principles of various embodiments.

DETAILED DESCRIPTION

Figure 1:
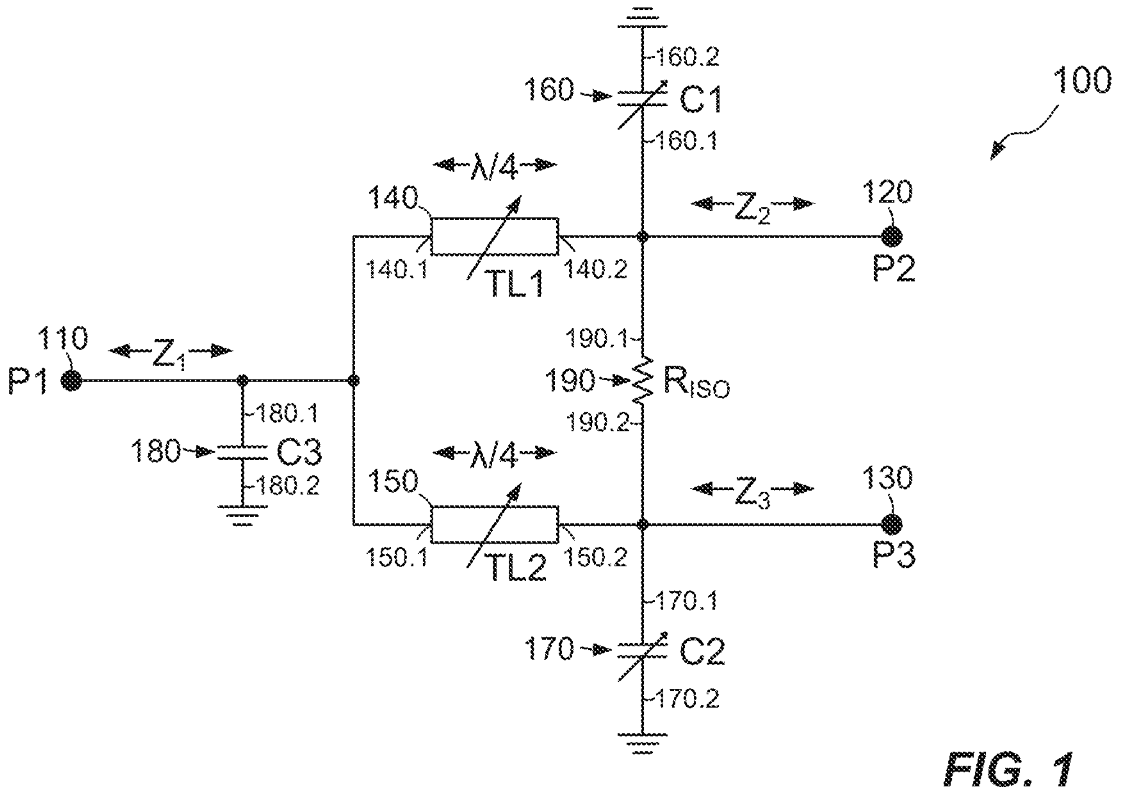
FIG. 1 is a schematic diagram of an example splitter/combiner with which one or more embodiments of the improved technique can be practiced.

Quarter-wave transformers as used in the above-described splitter/combiner circuits have electrical properties that are fixed by design, such as by the physical characteristics (e.g., lengths, widths, thicknesses) of the transmission lines and other factors. Once a quarter-wave transformer has been designed and implemented, it typically cannot be changed.

Fixed designs of splitter/combiner circuits have limitations that affect their usefulness. For example, devices made by semiconductor manufacturing processes have a spread of electrical characteristics, such that a splitter/combiner that performs well on paper may not perform as well in practice. Impedances may not be precisely matched, phase shifts may be inconsistent, and other variations can occur. Although it is possible to provide external circuits that tolerate these variations, doing so often adds complexity and degrades performance. Also, there is a strong preference in the industry for standardizing circuit components, such that the same design can be replicated in many places and in a variety of contexts. However, the fixed designs of splitter/combiner circuits resist standardization, given that they are normally designed specifically for their target applications. What is needed, therefore, is a splitter/combiner circuit that can be adjusted to be better suited to the specific application in which it is used.

The above need is addressed at least in part by an improved technique of splitting or combining electrical signals. The technique includes providing a splitter/combiner having first, second, and third ports. A first transmission line is electrically coupled between the first and second ports, and a second transmission line is electrically coupled between the first and third ports. A first capacitor is electrically coupled between the second port and a common node, and a second capacitor is electrically coupled between the third port and the common node. During operation, at least one of the first capacitor, second capacitor, first transmission line, and second transmission line is adjustable for varying the electrical properties of the splitter/combiner. Advantageously, the improved technique allows a splitter/combiner to be adjusted in place during operation, enabling tuning of its characteristics for achieving impedance matching and phase control and enabling the same adjustable design to be replicated across many different applications.

The improved technique may be realized in a variety of implementations. According to one or more embodiments, the first capacitor and the second capacitor are both adjustable for varying their respective capacitance values. According to one or more embodiments, both the first transmission line and the second transmission line are adjustable for varying their respective characteristic impedance and phase shift. According to one or more embodiments, the splitter/combiner further includes a third capacitor coupled between the first port and the common node. In such arrangements, the first capacitor and the second capacitor operate to increase an electrical length of the first transmission line, and the first capacitor and the third capacitor operate to increase an electrical length of the second transmission line. The "electrical length" of a transmission line is the phase shift (e.g., in degrees or radians) of an electrical signal that propagates from one end of the transmission line to the other at a particular design frequency.

The above-described splitter/combiner enables a range of adjustments, which include, for example, varying power delivered to the second and third ports while keeping a phase difference between the second and third ports constant, and varying the phase difference between the second and third ports while keeping the power division between the second and third ports constant. The adjustments may further include varying both the power division and the phase difference between the second and third ports orthogonally, i.e., independently of each other.

Embodiments of the improved technique will now be described. One should appreciate that such embodiments are provided by way of example to illustrate certain features and principles but are not intended to be limiting.

FIG. 1 is a schematic view of an example splitter/combiner 100 (i.e., a circuit configured for use as a splitter circuit, a combiner circuit, or both) according to one or more embodiments. The splitter/combiner 100 has a first port 110 (P1), a second port 120 (P2), and a third port 130 (P3). A first transmission line 140 (TL1) is electrically coupled between the first port 110 and the second port 120, and a second transmission line 150 (TL2) is electrically coupled between the first port 110 and the third port 130. For example, a first terminal 140.1 of the first transmission line 140 is electrically coupled to the first port 110, and a second terminal 140.2 of the first transmission line 140 is electrically coupled to the second port 120. Also, a first terminal 150.1 of the second transmission line 150 is electrically coupled to the first port 110, and a second terminal 150.2 of the second transmission line 150 is electrically coupled to the third port 130. In some examples, an isolation resistor 190 ($R_{ISO}$) is coupled between the second port 120 and the third port 130. For example, the resistor 190 has a first terminal 190.1 coupled to the second port 120 and a second terminal 190.2 coupled to the third port 130. In some examples, the isolation resistor 190 is an adjustable resistor, i.e., a resistor whose resistance can be varied during circuit operation. One should appreciate that a "terminal" of a circuit element as described herein refers to a point or region of the circuit element that is configured to electrically connect to a trace or to another circuit element. A "trace" as described herein refers to an electrically conductive feature, such as a portion of a patterned conductive layer of a semiconductor device or printed circuit board.

The splitter/combiner 100 further includes a first capacitor 160 (C1) electrically coupled between the second port 120 and a common node (shown using the ground symbol) and a second capacitor 170 (C2) coupled between the third port 130 and the common node. For example, a first terminal 160.1 of the first capacitor 160 is coupled to the second port 120 and a second terminal 160.2 of the first capacitor 160 is coupled to the common node. Likewise, a first terminal 170.1 of the second capacitor 170 is coupled to the third port 130 and a second terminal 170.2 of the second capacitor 170 is coupled to the common node. The common node may be coupled to a local ground or to any other potential to which one or more signals is referenced. The local ground may be electrically coupled to a ground reference terminal, which in turn may be coupled to a system ground reference, for example.

At least one of the first and second capacitors 160 and 170 is adjustable, meaning that its capacitance value can be varied during operation. Preferably, both capacitors 160 and 170 are adjustable. In some examples, at least one of the transmission lines 140 and 150 is itself adjustable, meaning that its characteristic impedance and its phase shift can be varied during operation. Preferably, both transmission lines 140 and 150 are adjustable in this manner. In an example, the transmission lines 140 and 150 are configured as quarter-wave transformers, i.e., their electrical lengths provide 90-degrees of phase shift (4) at a specified design frequency.

In some examples, the splitter/combiner 100 further includes a third capacitor 180 (C3), which is coupled between the first port 110 and the common node. For example, a first terminal 180.1 of the third capacitor 180 is coupled to the first port 110, and a second terminal 180.2 of the third capacitor 180 is coupled to the common node. In some examples, the third capacitor 180 may be implemented in first and second capacitor portions, one coupled between the first terminal 140.1 of the first transmission line 140 and the common node, and another coupled between the first terminal 150.1 of the second transmission line 150 and the common node.

In some examples, the capacitance value of the third capacitor 180 is adjustable. For example, adjusting the third capacitor 180 may enable matching of impedances from circuits driving the first port 110. In other examples, the third capacitor 180 is not adjustable. In further examples, the third capacitor 180 may be realized using parasitic capacitance between the first port 110 and the common node, such that no component is expressly provided. In still further examples, the third capacitor 180 is realized within the circuit driving the first port 110, i.e., by its output capacitance.

With terminals 140.1 and 140.2 coupled to capacitors 180 and 160, respectively, the electrical length of the first transmission line 140 is increased beyond that which would be provided if capacitors 180 and 160 were absent. Likewise, with terminals 150.1 and 150.2 coupled to capacitors 180 and 170, respectively, the electrical length of the second transmission line 150 is increased beyond that which would be provided if capacitors 180 and 170 were absent. The electrical length of the first transmission line 140 can thus be tuned at least in part by adjusting the capacitor 160 (and optionally the capacitor 180), and the electrical length of the second transmission line 150 can be tuned at least in part by adjusting the capacitor 160 (and optionally the capacitor 180). The effects of different values of capacitors 160, 170, and 180 on the behavior of the splitter/combiner 100 can be determined by simulation or by network analysis, for example.

Except for the adjustability of the first and second adjustable transmission lines 140, 150 and the inclusion of the first, second, and third adjustable capacitors 160, 170, 180, the basic design of the splitter/combiner 100 resembles that of the well-known Wilkinson power divider. However, the splitter/combiner 100 may be implemented in other ways and is not limited to Wilkinson-like designs.

The splitter/combiner 100 is capable of operating as both a power splitter and a power combiner. When operating as a power splitter, the splitter/combiner 100 receives an input signal at the first port 110 and provides first and second output signals at the second port 120 and the third port 130, respectively. Each of the output signals provides a fraction of the power of the input signal, with the sum of the power provided by the output signals not exceeding the power provided by the input signal. When operating as a power combiner, the splitter/combiner 100 receives first and second input signals at the second port 120 and the third port 130, respectively, and provides a single output signal at the first port 110. The power provided at the first port 110 does not exceed the sum of the powers provided at the second port 120 and the third port 130.

Operation of the splitter/combiner 100 as a power splitter will now be described. One should appreciate, though, that similar principles apply when operating the splitter/combiner 100 as a power combiner.

In typical operation, the first port 110 is coupled to a driving circuit (not shown) having an output impedance $Z_1$. Preferably, the impedance looking into port 110 is also $Z_1$, such that port 110 provides a matched load to the driving circuit. Likewise, the second port 120 preferably has an output impedance $Z_2$ and drives a load (not shown) having an input impedance $Z_2$. Also, the third port 130 preferably has an output impedance $Z_3$ and drives a load (not shown) having an input impedance $Z_3$. Thus, all ports 110, 120, and 130 are preferably matched.

The splitter/combiner 100 may be configured to provide equal power division, i.e., the same power to ports 120 and 130, or it may be configured to provide unequal power division, i.e., different power to ports 120 and 130. Equations for setting component values of power splitters for both equal power division and unequal power division would be understood by one of skill in the art, based on the description herein. Applying those equations to the splitter/combiner 100, one may define a constant K such that $K^2=P_3/P_2$, where $P_2$ is the power delivered by the second port 120 and $P_3$ is the power delivered by the third port 130. A value of K=1 thus represents an equal power division, and values of K different from 1 represent unequal power divisions.

In this arrangement, component values for achieving a desired value of K, and thus a desired power division, may be established as follows:

$$Z_3 = Z_1\sqrt{\frac{1+K^2}{K^3}};$$

$$Z_2 = K^2 Z_1;$$

and $$R_{ISO} = Z_1\left(K + \frac{1}{K}\right).$$

The above equations assume terminated loads on all ports 110, 120, and 130. One should appreciate, though, that the splitter/combiner 100 may also be used with one or more unterminated loads.

The splitter/combiner 100 may be adjustable in a variety of ways. For example, power division and phase shifts between ports 120 and 130 can be adjusted by varying the capacitance values of capacitors 160 and/or 170 and/or by varying the characteristic impedances and phase shifts of the transmission lines 140 and/or 150. Simulations have shown that power division may be adjusted orthogonally with phase shift and at a fine level of granularity.

Figure 2A:
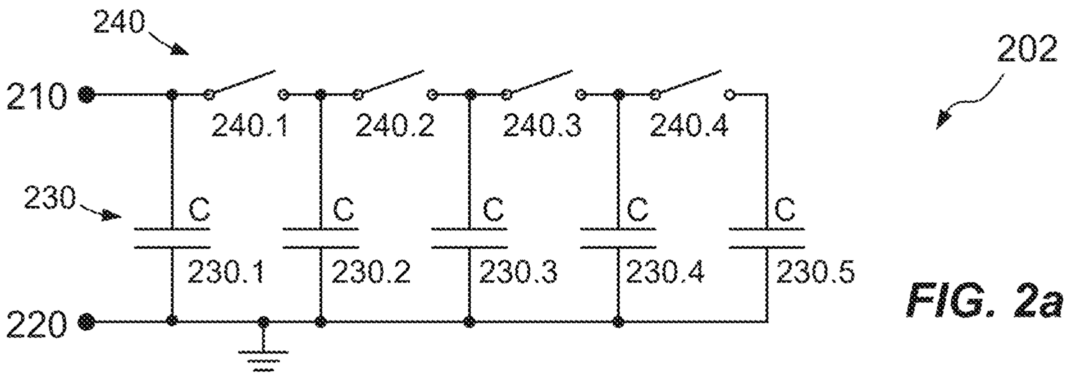
FIG. 2*a* is a schematic diagram of a first example adjustable capacitor according to one or more embodiments.
Figure 2B:
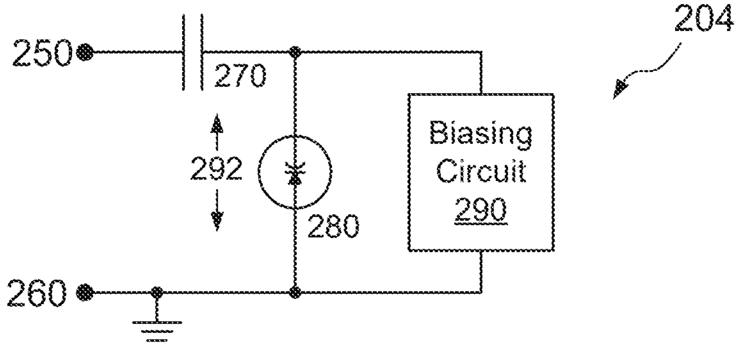
FIG. 2*b* is a schematic diagram of a second example adjustable capacitor according to one or more embodiments.

FIGS. 2*a* and 2*b* respectively show first and second examples of adjustable capacitors, which are suitable for realizing capacitors 160 and 170 according to one or more embodiments. Similar examples may be suitable for realizing capacitor 180 if it is desired that capacitor 180 be adjustable, as well. The illustrated examples are not intended to be exhaustive but rather to identify feasible examples.

FIG. 2*a* is a schematic diagram of a first example 202 of an adjustable capacitor in the form of a switched capacitor network, according to one or more embodiments. The adjustable capacitor 202 has a first terminal 210 and a second terminal 220, which may correspond to the first terminal and second terminal of any of the capacitors shown in FIG. 1. The second terminal 220 is coupled to the common node. The adjustable capacitor 202 includes multiple capacitor elements 230, e.g., capacitor elements 230.1 through 230.5. In this example, all capacitor elements 230 are assumed to have the same capacitance value, which may be designated as "C." Multiple switches 240 (e.g., 240.1 through 240.5) are provided for successively coupling the capacitor elements 230 to the terminals 210 and 220. Each of the switches 240 has a connection state (e.g., open or closed). If all switches 240 are open, the capacitance value between terminals 210 and 220 is C, which is provided by capacitor 230.1. The capacitance value then increases by C for each successive switch 240 that is closed. For example, closing switch 240.1 changes the capacitance to 2C, closing both switches 240.1 and 240.2 increases the capacitance to 3C, and so on. The example of FIG. 2a is highly simplified and is intended to be illustrative rather than limiting. Actual implementations may include different numbers of capacitor elements 230 and different switching arrangements, which may allow capacitor elements 230 to be coupled in a variety of parallel and/or series combinations. In a semiconductor device, the capacitor elements 230 may be implemented, for example, as vertically-aligned metallized patches on different metallization layers, and the switches 240 may be implemented as transistors, such as FETs (field-effect transistors) or BJTs (bipolar junction transistors), which may be formed in a semiconductor substrate of the device. In an example, the device, or the system that contains the device, further includes control circuitry constructed and arranged to operate the switches 240, i.e., to open and/or close them for achieving desired values of capacitance.

FIG. 2B is a schematic diagram of a second example 204 of an adjustable capacitor according to one or more embodiments. Here, the adjustable capacitor 204 has a first terminal 250 and a second terminal 260, which may correspond to the first terminal and second terminal of any of the capacitors shown in FIG. 1. The second terminal 260 is coupled to the common node. The capacitance value of the adjustable capacitor 204 is established mainly by a reverse-biased diode 280, whose capacitance value is varied based on a reverse voltage 292 applied across its P-N junction. The adjustable capacitor 204 includes a biasing circuit 290 for producing the voltage 292 and adjusting the voltage 292 for establishing different values of capacitance across the diode 280.

In an example, the above-described control circuitry is constructed and arranged to control the biasing circuit 290. For example, the control circuitry stores data that associates multiple voltages 292 with corresponding values of capacitance across the diode 280. In response to a request to provide a desired capacitance of the diode 280, the control circuitry identifies an associated voltage 292 and directs the biasing circuit 290 to apply that voltage 292 across the diode 280.

In some examples, the adjustable capacitor 204 further includes a decoupling capacitor 270 configured to decouple the biasing voltage 292 from the terminal 250. In an example, the capacitance value of the decoupling capacitor 270 is much greater than that of the diode 280, such that the decoupling capacitor 270 contributes little to the capacitance across the terminals 250 and 260. Preferably, the diode 280 is a varactor diode, but other types of diodes may be used. The example shown is highly simplified and is intended merely for illustration.

Example features of the adjustable transmission lines 140 and 150 according to one or more embodiments will now be described with reference to FIGS. 3-8. Although these figures illustrate one way of achieving adjustability in a transmission line, one should appreciate that there are other ways of making transmission lines adjustable and that the disclosure is not limited to the specific example shown.

Figure 3:
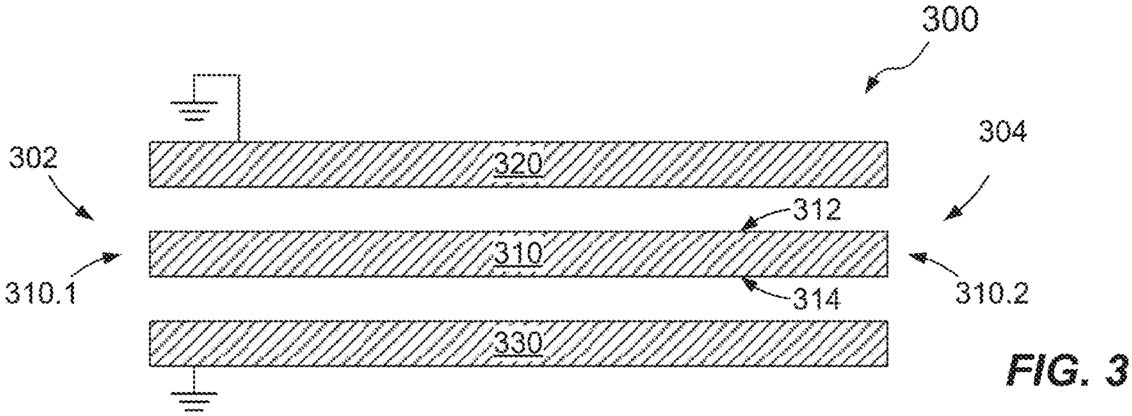
FIG. 3 is a top plan view of an example transmission structure that forms a portion of an adjustable transmission line according to one or more embodiments.

FIG. 3 is a top plan view of an example transmission structure 300 that forms part of an adjustable transmission line according to one or more embodiments. The transmission structure 300 includes a first conductive trace 310, a second conductive trace 320, and a third conductive trace 330, all running in parallel. The second conductive trace 320 is spaced apart from a first side 312 of the first trace 310, and the third conductive trace 330 is spaced apart from a second side 314 of the first trace 310. The first, second, and third conductive traces preferably have the same or similar lengths. The lengths of the depicted traces 310, 320, and 330 may be arbitrarily long.

The first conductive trace 310 may also be referred to herein as a "central" trace, and the second and third conductive traces 320 and 330 may also be referred to herein as "lateral" traces. The first conductive trace 310 extends from a proximal end 310.1 to a distal end 310.2. In some examples, the proximal end 310.1 provides a signal input 302 and a first terminal (e.g., 140.1 or 150.1) of the adjustable transmission line and the distal end 310.2 provides a signal output 304 and a second terminal (e.g., 140.2 or 150.2) of the adjustable transmission line. Both the input 302 and the output 304 are relative to the lateral traces 320 and 330, which are coupled to the common node, e.g., grounded.

The first conductive trace 310, second conductive trace 320, and third conductive trace 330 are preferably coplanar and may be formed on a first layer of a device or assembly, such as in a first metallization layer of a semiconductor device, a first layer of a printed circuit board, a first layer of a ceramic substrate, or the like. Preferably, both the area between the first conductive trace 310 and the second conductive trace 320 and the area between the first conductive trace 310 and the third conductive trace 330 are devoid of metal material. For example, an insulating material such as a dielectric and/or air fills the lateral spaces between the central trace 310 and the lateral traces 320 and 330.

Figure 4:
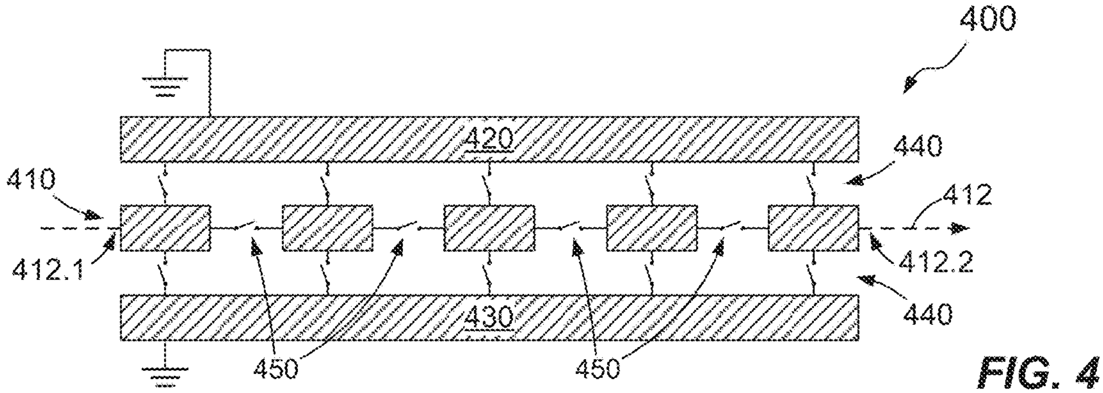
FIG. 4 is a top plan view of an example shield structure that forms another portion of an adjustable transmission line with switches shown schematically, according to one or more embodiments.

FIG. 4 shows a top plan view of an example shield structure 400 of the adjustable transmission line according to one or more embodiments. The shield structure 400 may be disposed directly below the transmission structure 300 (or directly above, from a different vantage point) and includes a fourth conductive trace 420, a fifth conductive trace 430, and a plurality of spaced-apart, conductive shield elements 410. The shield elements 410 extend in a line 412 that is parallel to and spaced apart from the fourth conductive trace 420 and the fifth conductive trace 430. Although five shield elements 410 are shown, one should appreciate that any number of shield elements 410 may be provided, from just two to tens or even hundreds, as applications require and technological constraints allow. The fourth conductive trace 420 and the fifth conductive trace 430 may also be referred to herein as "lateral" traces of the shield structure 400.

The shield structure 400 is arranged such that the fourth conductive trace 420 extends directly below and parallel to the second conductive trace 320 and the fifth conductive trace 430 extends directly below and parallel to the third conductive trace 330. Also, the shield elements 410 extend directly below the first conductive trace 310, from a first location 412.1 normally disposed directly below the proximal end 310.1 of the first conductive trace 310 and a second location 412.2 normally disposed directly below the distal end 310.2 of the first conductive trace 310. There is no requirement, though, that the first location 412.1 coincide precisely with the proximal end 310.1 or that the second location 412.2 coincide precisely with the distal end 310.2.

In an example, the fourth conductive trace 420, fifth conductive trace 430, and shield elements 410 are coplanar and are formed on a second layer of the above-described device or assembly, such as a second metallization layer of a semiconductor device, a second layer of a printed circuit board, a second layer of a ceramic substrate, or the like. In such an example, the first and second layers of the above-described device or assembly are physically and electrically separated by one or more layers of electrically insulating material. In other examples, the fourth conductive trace 420, fifth conductive trace 430, and shield elements 410 are not coplanar. For example, the shield elements 410 may be formed on a lower or higher metallization layer than the traces 420 and 430, which may be formed on the same layer. Also, different shield elements 410 may be formed on different layers.

One should appreciate that the terms "first layer," "second layer," and the like serve merely as identifiers and are not intended to denote any particular sequence. For example, the device or assembly may include other metal layers above or below the "first layer" and one or more additional metal layers may be included between the first layer and the second layer. In some examples, such additional metal layers are preferably devoid of metal material in the space between the transmission structure 300 and the shield structure 400. In some examples, the selection of metal layers on which to place the transmission structure 300 and shield structure 400 is based on electrical characteristics, such as desired capacitance and inductance and the dielectric constant of insulating material that separates the metallization layers.

FIG. 4 further shows various switches, which include "shunt" switches 440 and "series" switches 450. The switches 440 and 450 are shown schematically, as they typically are not formed on the same layer or layers as the shield structure 400 but rather are formed elsewhere in the device or assembly, such as in a semiconductor substrate or with discrete components. The shunt switches 440 are arranged to selectively electrically couple respective shield elements 410 to the lateral traces 420 and 430, and the series switches 450 are arranged to selectively electrically couple adjacent shield elements 410 to each other. Although two shunt switches (upper and lower) are shown for each shield element 410, one or more embodiments may include only a single shunt switch (upper or lower) per shield element 410. Also, the terms "shunt" and "series" are used herein merely to distinguish the two groups of switches 440 and 450. Other connotations of the words "shunt" and "series" are not intended.

Preferably, the switches 440 and 450 are implemented using single transistors, such as single MOSFETs (metal-oxide-semiconductor field-effect transistors) or BJTs, or using PIN (positive-intrinsic-negative) diodes. SOI (silicon-on-insulator) technology is particularly suitable for use in devices that are configured to convey high-frequency signals (tens or hundreds of gigahertz), given the low insertion loss and wide bandwidth that this technology can achieve.

Although FIG. 4 does not explicitly show control inputs to the switches 440 and 450, one should appreciate that each switch preferably has a control input. The control input has an open condition (e.g., voltage or current) that causes the switch to open, forming a high-resistance path between the contacts, and a closed condition that causes the switch to close, forming a low-resistance path between the contacts. With transistors, a control terminal provides the control input, and current-carrying terminals provide the contacts. For instance, the gate terminal of a FET provides the control input and the drain and source terminals provide the contacts. With BJTs, the base terminal provides the control input and the collector and emitter terminals provide the contacts. In typical operation, the lateral traces 420 and 430 are coupled to the common node (e.g., grounded). Also, the shield elements 410 are electrically floating when all switches are opened, and the shield elements 410 are coupled to the common node when the switches provide a path to grounded traces 420 and/or 430. In this context, the drain and source of a FET, or the collector and emitter of a BJT, can be connected in either direction.

Preferably, the control circuitry is constructed and arranged to operate the depicted switches 440 and 450 individually. However, some implementations may operate certain switches together (e.g., synchronously). For example, upper and lower shunt switches 440 for a particular shield element 410 may be operated together, e.g., responsive to a single control signal from the control circuitry. Alternatively, the upper and lower shunt switches for a particular shield element 410 may be operated separately.

Figure 5:
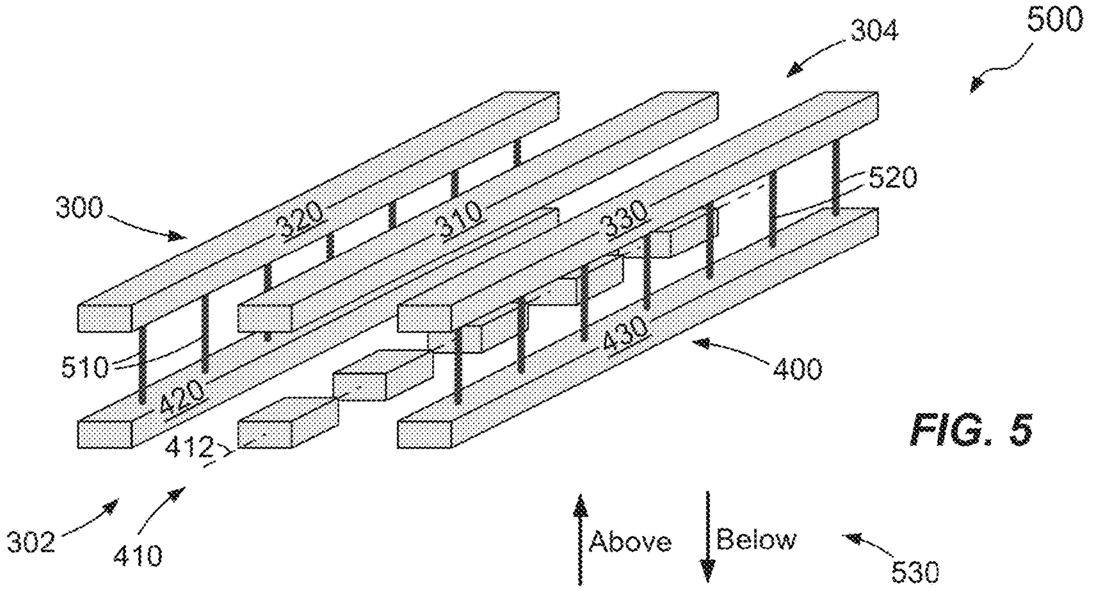
FIG. 5 is a simplified isometric view of the adjustable transmission line formed using the transmission structure of FIG. 3 and the shield structure of FIG. 4 according to one or more embodiments.

FIG. 5 shows a three-dimensional, isometric view of an example of the above-described adjustable transmission line, labeled here with reference numeral 500. As shown, the adjustable transmission line 500 includes the transmission structure 300 (FIG. 3) and the shield structure 400 (FIG. 4). Switches 440 and 450 are omitted from FIG. 5 for the sake of clarity, but it should be understood that switches 440 and/or 450 would be included in the adjustable transmission line 500. The shield structure 400 is disposed below the transmission structure 300 in the manner described above, i.e., with lateral traces 420 and 430 running below and parallel to the lateral traces 320 and 330, respectively, and with shield elements 410 extending in a line 412 below the central trace 310. In the example shown, the lateral traces 420 and 430 are coplanar with the shield elements 410, which are coplanar with one another.

As further shown in FIG. 5, multiple conductive paths 510 electrically connect the lateral trace 320 of the transmission structure 300 to the lateral trace 420 of the shield structure 400. Likewise, multiple conductive paths 520 electrically connect the lateral trace 330 of the transmission structure 300 to the lateral trace 430 of the shield structure 400. The conductive paths 510 and 520 may be realized using conductive vias or other vertical conduction structures, for example, which extend through the insulating layer(s) between traces 320 and 420 and between traces 330 and 430. Although not shown, additional electrical connections may be formed between the lateral traces 320 and 330 and/or between the lateral traces 420 and 430, ensuring that all lateral traces 320, 330, 420, and 430 are at the same potential, i.e., that of the common node, which is typically ground when the adjustable transmission line 500 is integrated into a larger electrical system.

A legend 530 at the bottom right of FIG. 5 depicts a convention used herein for distinguishing vertical positions of elements. The terms "above" and "below," along with similar terms, designate relative vertical positions from the frame of reference shown in legend 530. The terms do not necessarily correspond to terrestrial notions of "above" and "below" or "up" and "down," however. Thus, a first feature may be identified herein as "below" or "beneath" a second feature even though the second feature appears to be above the first feature from a particular observer's point of view.

Although FIG. 5 shows only a single shield structure 400, which is below the transmission structure 300, according to one or more embodiments a second shield structure 400 may be provided above the transmission structure 300, such that the transmission structure 300 is sandwiched between two shield structures. Conduction paths like 510 and 520 may be provided between the transmission structure 300 and the second shield structure. The second shield structure provides additional programmability for characteristic impedance and phase shift, as well as additional shielding around the central trace 310.

According to one or more embodiments, one or both lateral traces 420 and 430 may be omitted, and the contacts of the shunt switches 440 that would otherwise connect to the traces 420 and 430 may instead electrically connect to the lateral traces 320 and 330, e.g., using vias. Thus, a similar electrical effect can be achieved without the need for lateral traces 420 and 430.

Referring also to FIG. 1, and according to one or more embodiments, both the first transmission line 140 and the second transmission line 150 are implemented using respective instances of the adjustable transmission line 500. To this end, the first transmission line 140 includes a first plurality of shield elements 410 that are individually switchable, e.g., using shunt switches 440 or using both shunt switches 440 and series switches 450, to the common node during operation. Different combinations of switch settings establish respective values of characteristic impedance and phase shift for the first transmission line 140. Likewise, the second transmission line 150 includes a second plurality of shield elements 410 that are individually switchable, e.g., using shunt switches 440 or using both shunt switches 440 and series switches 450, to the common node during operation, with different combinations of switch settings establishing respective values of characteristic impedance and phase shift for the second transmission line 150.

Figure 6A:
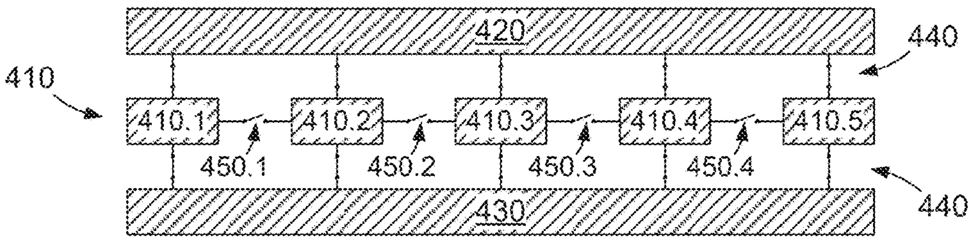
FIGS. 6*a*-6*c* are top plan views of the example shield structure of FIG. 4 in which switches are shown schematically in various switch configurations for achieving respective values of characteristic impedance and phase shift, according to one or more embodiments.
Figure 6B:
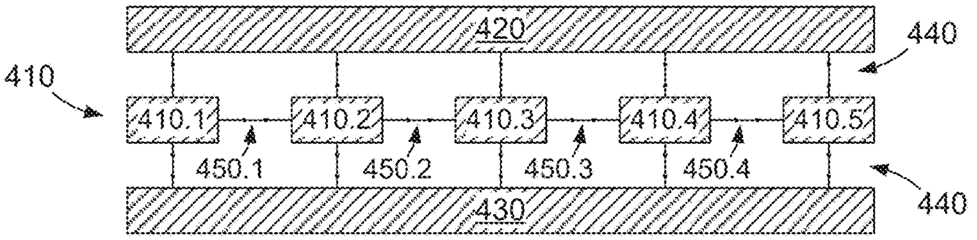
Figure 6C:
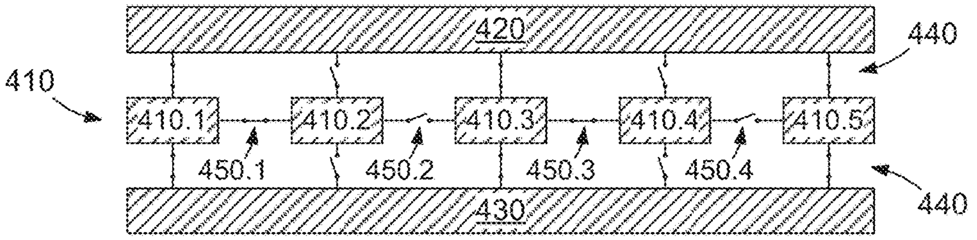

FIGS. 6*a* through 6*c* show various examples of switch settings that may be realized for the shunt switches 440 and series switches 450 of FIG. 4. Here, individual shield elements 410.1 through 410.5 and individual series switches 450.1 through 450.4 are shown. In FIG. 6A, all shunt switches 440 are closed and all series switches 450.1 through 450.4 are opened. This switch configuration causes the adjustable transmission line 500 to assume high capacitance and low inductance along the signal path from the input 302 to the output 304 (FIG. 3), resulting in comparatively low characteristic impedance compared with other switch configurations. In FIG. 6B, all switches are closed, resulting in both high capacitance and high inductance. In FIG. 6C, an alternating arrangement is applied, where shunt switches 440 of every other shield element 410 are closed, and every other series switch 450 is closed. Given the 14 switches illustrated, a total of $2^{14}$ unique switch configurations is possible.

Figure 7:
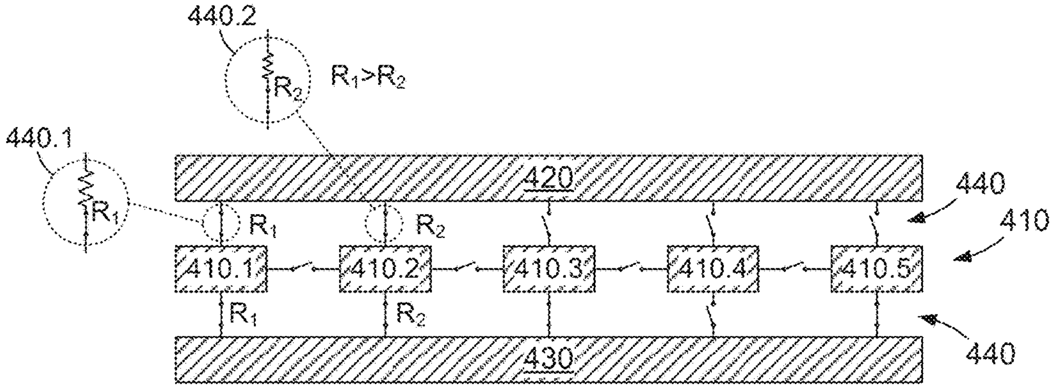
FIG. 7 is a top plan view of the example shield structure of FIG. 4 in which first and second shunt switches for a particular shield element have respective resistances that differ from each other, according to one or more embodiments.

FIG. 7 shows another example arrangement of switches. Here, different shunt switches 440 may be provided having different series resistances. For example, switch 440.1 has series resistance $R_1$ and switch 440.2 has series resistance $R_2$, where $R_1$ is greater than $R_2$. Different resistances may be realized, for example, using different resistor components or by using transistors (or other switches) having different intrinsic resistances, such as switches having different sizes. As another example, different resistances may be established by varying the degree to which transistors are turned on. For example, a transistor may assume a lower resistance by turning the transistor more fully on and may assume a higher resistance by turning the transistor less fully on, e.g., by operating the transistor in its linear range. Regardless of how different resistances are achieved, the ability to provide different resistances in different switches provides an additional source of variability in characteristics that the adjustable transmission line 500 may assume. Although only shunt switches 240 are shown as having different resistances, further variability can be achieved by providing series switches 250 with different resistances. In some examples, the switches 240 and/or 250 may have not only resistive components to their impedance but also reactive components, which may be varied in different switches by using different capacitors or by using varactors, for example.

Figure 8:
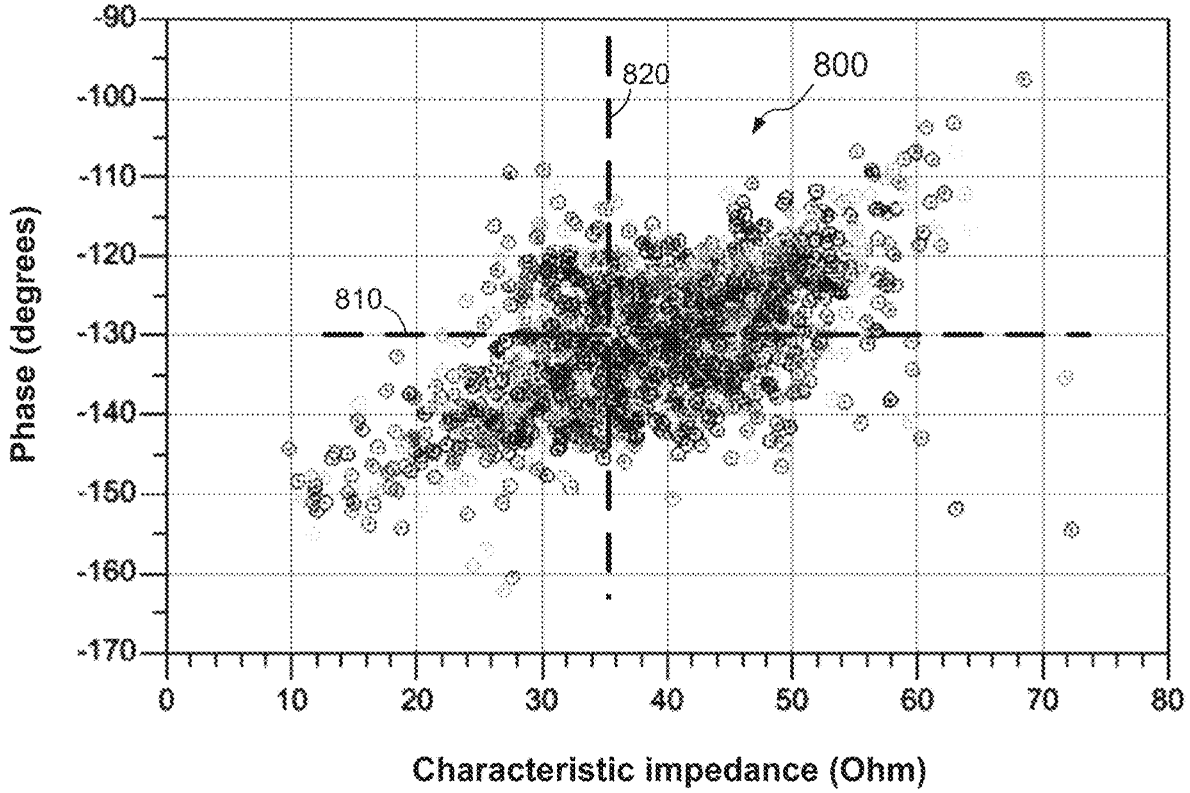
FIG. 8 is a scatter plot of phase shift versus characteristic impedance of an adjustable transmission line according to one or more embodiments, based on varying both shunt switches and series switches.

FIG. 8 shows an example scatter plot 800 that results from simulating an adjustable transmission line 500 having a total of 44 switches, including 30 shunt switches 440 and 14 series switches 450. For this example, it is assumed that both shunt switches 440 for each shield element 410 are controlled by a single control bit, and that all series switches 450 are controlled by respective control bits. The 29 control bits give a total of 229 possible switch configurations for the adjustable transmission line 500. As simulating all 229 scenarios is not computationally practical, plot of FIG. 8 is generated using Monte-Carlo sampling. Open switches are modeled as one-megaohm resistors, and closed switches are modeled as one-microohm resistors. All phase shifts are reference to a 90 GHz test signal.

In the scenario of FIG. 8, both the shunt switches 440 and the series switches 450 are varied between being open and closed. Here, the range of possibilities is large, with characteristic impedance varying between about 10 ohms and about 72 ohms (greater than a factor of 7) and phase shift varying between about −97 degrees and −163 degrees (nearly a factor of 1.7). FIG. 8 clearly demonstrates that the combination of shunt switches 440 and series switches 450 creates a large design space of possible values of characteristic impedance and phase shift. Further, it should be emphasized that the plot 800 is the result of sampling and thus is expected to understate the maximum ranges of variability that can be achieved.

It is clear from the plot 800 that characteristic impedance and phase shift can be varied orthogonally to each other. For example, line 810 represents a particular phase shift (about −130 degrees) and intersects a large number of points, showing that the same common value of phase shift can be achieved over a wide range of characteristic impedances. Likewise, line 820 represents a particular characteristic impedance (about 35 ohms) and intersects a large number of points, showing that the same common value of characteristic impedance can be achieved over a wide range of phase shifts.

The results shown in FIG. 8 assume ideal switches. Performance may be reduced somewhat when using actual switches, particularly at high frequencies. For example, simulations have been run at 90 GHz that assume switches having a 75-femtosecond FOM (figure of merit; e.g., $R_{DS-ON}*C_{DS-OFF}$) and 10-femtofarad (fF) off-capacitance. Such simulations still provide 45 degrees of phase tuning range and 35 ohms of characteristic-impedance tuning range. The quality of switches becomes less critical when operating at lower frequencies.

Although the plot 800 shows a space of options that result from varying both shunt switches 440 and series switches 450, one should appreciate that orthogonal control over characteristic impedance and phase can be achieved even if only shunt switches 440 are varied, or even if only series switches 450 are varied. However, varying both shunt switches 440 and series switches 450 has been found to provide a larger space of options for characteristic impedance and phase control than does varying either shunt switches 440 or series switches 450 alone.

Figure 9:
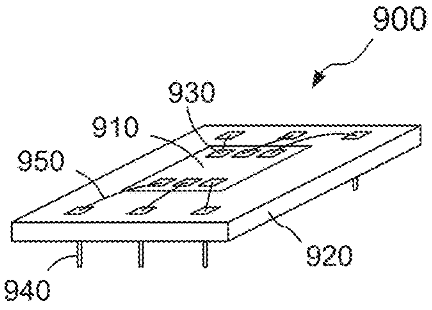
FIG. 9 is an isometric view of an example device in which the splitter/combiner of FIG. 1 may be implemented, according to one or more embodiments.

As mentioned previously, the splitter/combiner 100 may be implemented within a device. FIG. 9 shows a simplified example device 900 according to one or more embodiments. The device 900 includes a semiconductor die 910 mounted within a package 920. The die 910 includes circuitry that realizes the splitter/combiner 100. Bond pads 930 of the die 910 are coupled to contacts 940 using bonding wires 950. In an example, the bond pads 930 carry signals, power, and ground to and from the die 910. The contacts 950 may be pins, balls (for ball grid arrays), leads, or other types of electrical contacts. In some arrangements, the bond pads 930 are formed on a top-most metallization layer of the die 910. In other arrangements, the bond pads 930 are formed on a substrate of the die 910, in a so-called "flip-chip" arrangement. In such cases, the die 910 may be mounted with the substrate facing up. Indeed, a flip-chip arrangement may be preferred at certain frequencies (e.g., tens of gigahertz and above), as it avoids the use of bond wires, which can impair signal integrity. In some examples, multiple dies may be included within a single package 920, with connections formed between them. For example, the device 900 may include a system substrate, such as a ceramic substrate or small printed circuit board, with connections formed between different dies and other components within the substrate, such as surface-mount components. A great deal of variety is possible, and the example shown in FIG. 9 is intended merely for illustration.

Figure 10:
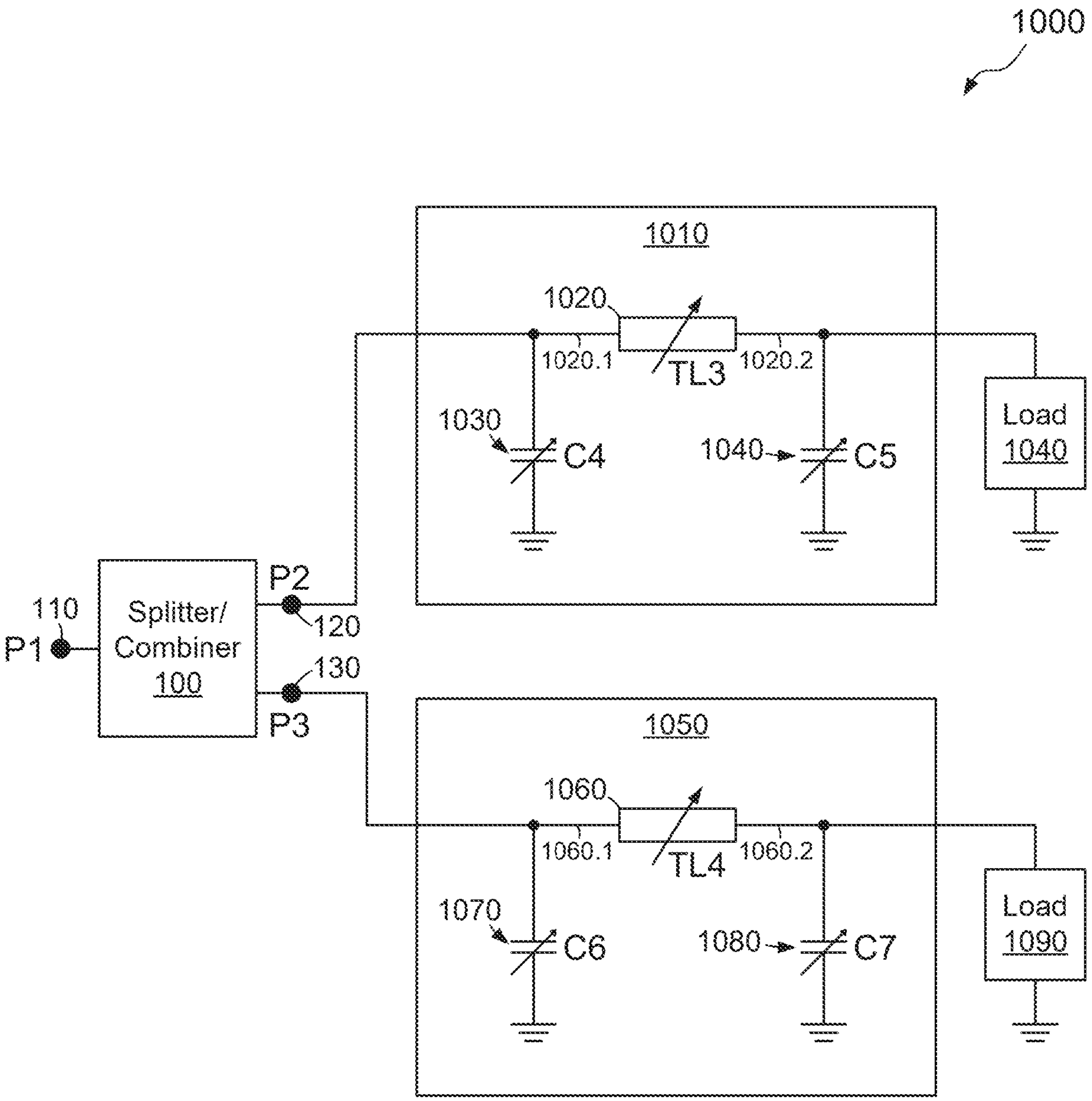
FIG. 10 is a schematic view of an example splitter/combiner electrically coupled to first and second impedance matching networks, according to one or more embodiments.

FIG. 10 shows an example circuit 1000 which may be provided along with the splitter/combiner 100 within the device 900 according to one or more embodiments. Here, the second port 120 of the splitter/combiner 100 is coupled to a first IMN (impedance matching network) 1010 and the third port 130 of the splitter/combiner 100 is coupled to a second IMN 1050. The first and second IMNs 1010 and 1050 are constructed and arranged to provide impedance matching to respective loads 1040 and 1090 (e.g., amplifiers or other loads). One should appreciate, though, that some embodiments may include only one IMN, i.e., either the first IMN 1010 or the second IMN 1050.

The first IMN 1010 includes a transmission line 1020 (TL3). The transmission line 1020 has a first terminal 1020.1 coupled to the second port 120 of the splitter/combiner 100 and a second terminal 1020.2 coupled to the load 1040. In an example, the transmission line 1020 is adjustable, e.g., in any of the ways described above for transmission lines 140 and 150. For example, the transmission line 1020 includes a plurality of shield elements 410 that are individually electrically switchable, e.g., via shunt switches 440, to the common node during operation, for establishing multiple values of characteristic impedance and multiple values of phase shift, in the manner described above. In some examples, the shield elements 410 are further electrically switchable (e.g., via series switches 450) for connecting to adjacent shield elements 410 in series.

The first IMN 1010 further includes an adjustable capacitor 1030 (C4) and an adjustable capacitor 1040 (C5). The capacitor 1030 is coupled between the first terminal 1020.1 of the transmission line 1020 and the common node, and the capacitor 1040 is coupled between the second terminal 1020.2 of the transmission line 1020 and the common node. The capacitors 1030 and 1040 may be adjustable in any of the ways described above for capacitors 160 and 170, for example.

The second IMN 1050 is constructed similarly to the first IMN 1010, although it may be configured with different settings from the first IMN 1010 at any given time. The second IMN 1050 includes a transmission line 1060. A first terminal 1060.1 of the transmission line 1060 is coupled to the third port 130 of the splitter/combiner 100 and to a first terminal of capacitor 1070 (C6), the other terminal of which is coupled to the common node. A second terminal 1060.2 of the transmission line 1060 is coupled to the load 1090 and to a first terminal of capacitor 1080 (C7), the other terminal of which is coupled to the common node. In an example, the transmission line 1060 and the capacitors 1070 and 1080 are each adjustable, e.g., using any of the approaches described above.

Use of the IMNs 1010 and/or 1050 can have favorable effects on performance of the splitter/combiner 100. For example, when providing high levels of power division, such as 6 dB, between the ports 120 and 130, performance factors such as return loss and isolation may become degraded. However, adjusting the load impedances via IMNs 1010 and/or 1050 can restore return loss and isolation to baseline values, enabling high performance even at high levels of power division.

Figure 11:
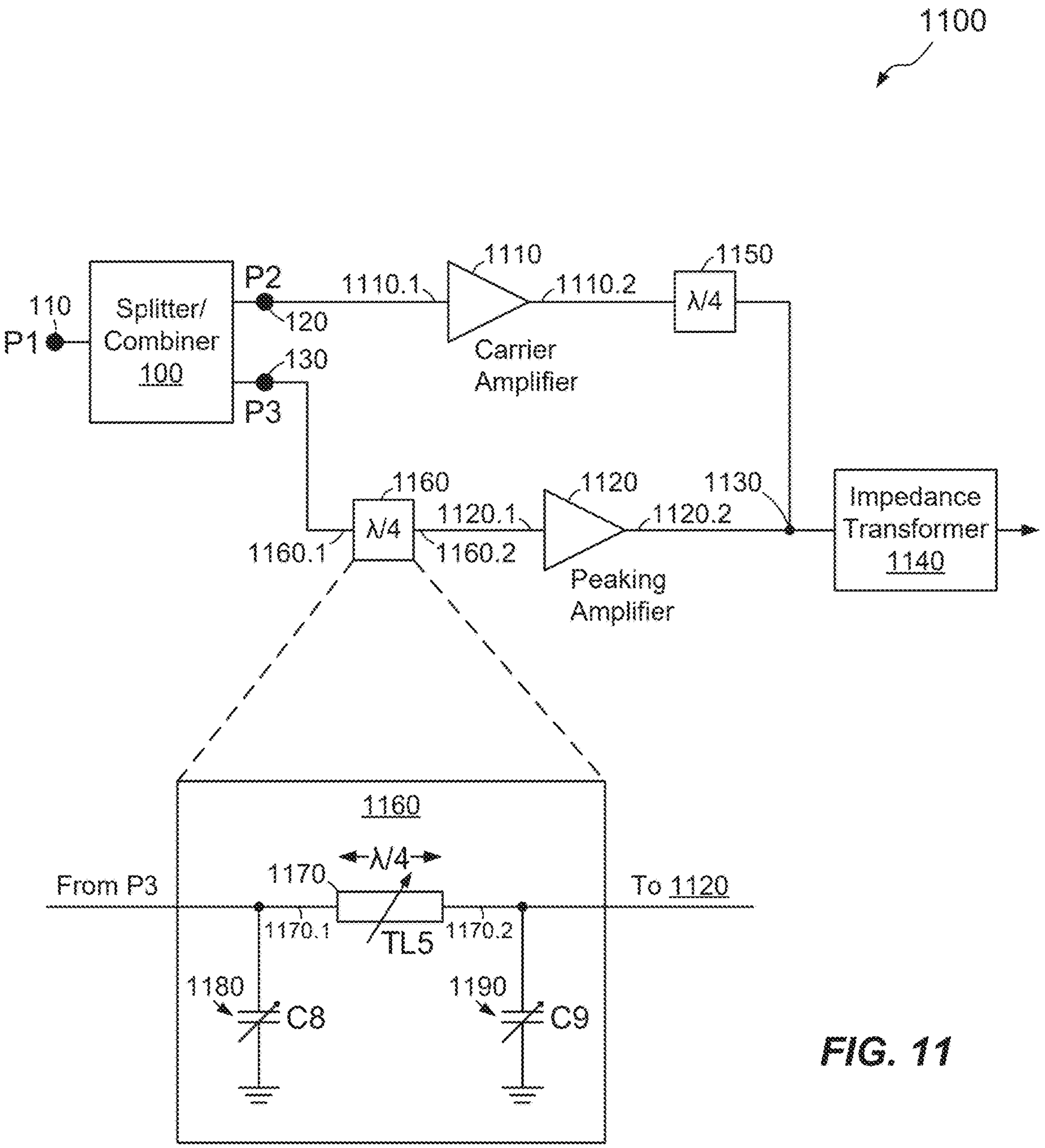
FIG. 11 is a schematic view of an example splitter/combiner and an example phase shifter that form portions of a Doherty amplifier, according to one or more embodiments.

FIG. 11 shows an example Doherty amplifier 1100 that may be provided within the device 900 according to one or more embodiments. As is known, Doherty amplifiers include a signal splitter 100 (e.g., an instance of splitter/combiner 100, FIG. 1), which receives an input RF signal at the first port 110. The splitter 100 divides the power of the input RF signal into a first RF signal that is provided at the second port 120 to a carrier amplifier 1110 and into a second RF signal that is provided at the third port 130 to a peaking amplifier 1120. The carrier amplifier 1110 has an input terminal 1110.1 and an output terminal 1110.2, and the peaking amplifier 1120 has an input terminal 1120.1 and an output terminal 1120.2. After amplification of the first and second RF signals by the carrier and peaking amplifiers 1110 and 1120, respectively, the amplified first and second RF signals are combined in phase at a combining node 1130, and the combined RF signal is conveyed through an impedance transformer 1140 to an output of the amplifier. During operation, the carrier amplifier 1110 is biased to operate in class AB mode, and the peaking amplifier 1120 is biased to operate in class B mode or class C mode.

The Doherty amplifier 1100 further includes a quarter-wave transformer 1150 between the output terminal 1110.2 of the carrier amplifier 1110 and the combining node 1130. The quarter-wave transformer 1150 is configured to impart about a 90-degree delay to the amplified first RF signal produced by the carrier amplifier 1110, while also implementing an impedance inversion. To compensate for the 90-degree delay imparted by the quarter-wave transformer 1150, the Doherty amplifier 1100 further includes a phase shifter 1160 between port 130 of the splitter 100 and the input terminal 1120.1 of the peaking amplifier 1120. The phase shifter 1160 has a first terminal 1160.1 and a second terminal 1160.2 and is configured to impart about a 90-degree delay to the second RF signal before it is amplified by the peaking amplifier 1120. The phase shifts applied by the quarter-wave transformer 1150 and the phase shifter 1160 ensure that the amplified first and second RF signals arrive in phase at the combining node 1130, as is needed for proper operation of the Doherty amplifier 1100. In an example, the phase shifter 1160 is provided as a quarter-wave transformer (24).

An example implementation of the phase shifter 1160 is shown at the bottom of FIG. 11. Here, the phase shifter 1160 includes a transmission line 1170 (TL5), an input capacitor 1180 (C8), and an output capacitor 1190 (C9). The transmission line 1170 has a first terminal 1170.1 and a second terminal 1170.2. The input capacitor 1180 is coupled between the first terminal 1170.1 of the transmission line 1170 and the common terminal, and the output capacitor 1190 is coupled between the second terminal 1170.2 of the transmission line 1170 and the common terminal. Preferably, the transmission line 1170 is adjustable, e.g., in any of the ways described above for transmission lines, and at least one of the capacitors 1180 and 1190 is adjustable, e.g., in any of the ways described above for capacitors.

One should appreciate that Doherty amplifiers can be arbitrarily complex and that the example shown is intended to be simplified for purposes of illustration. The adjustability of the splitter/combiner 100 and of the phase shifter 1160 enables accurate phase control in situ, thus promoting optimal performance of the Doherty amplifier 1100.

Figure 12:
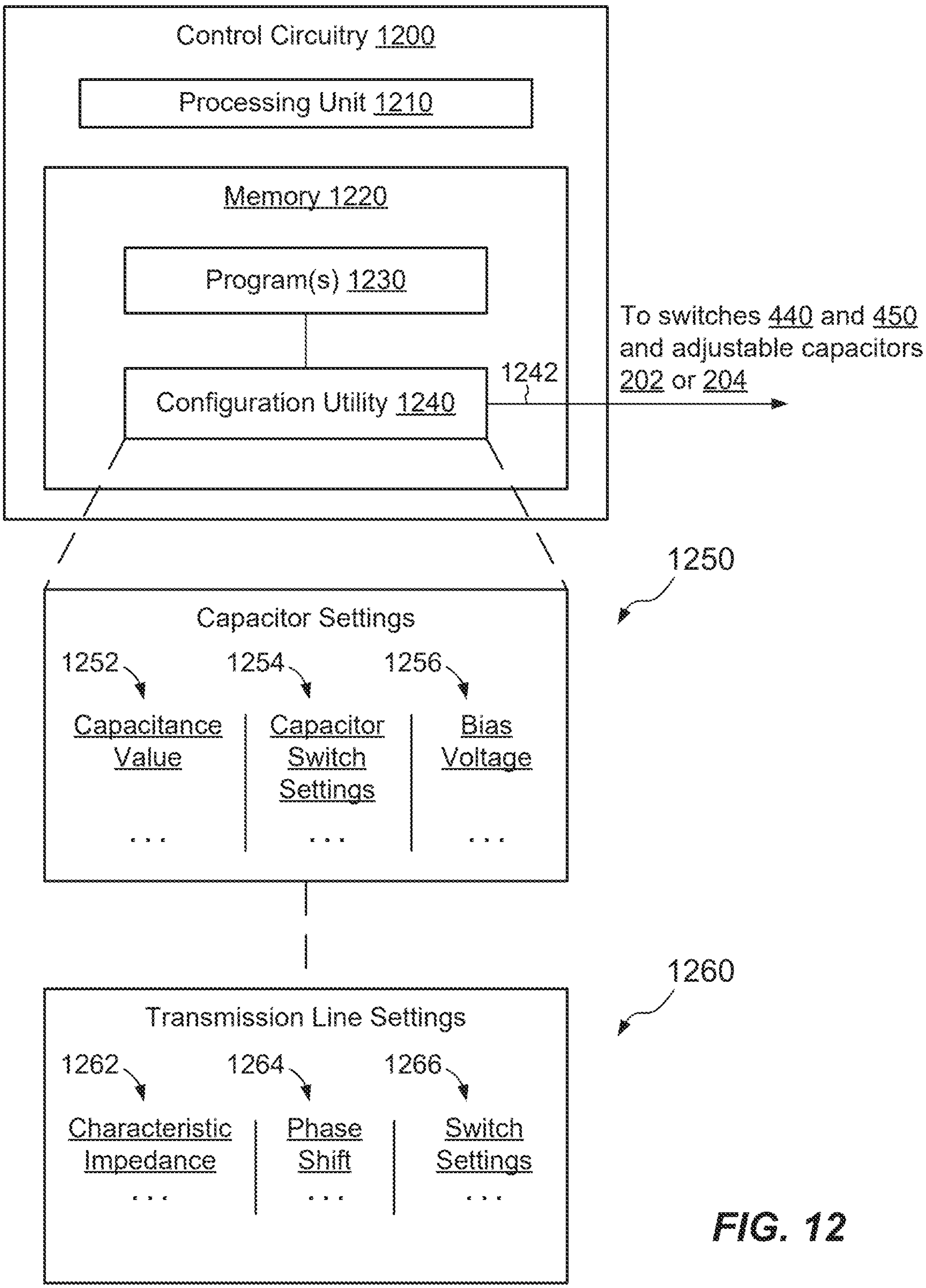
FIG. 12 is a block diagram of example control circuitry that may be used to control the splitter/combiner according to one or more embodiments.

FIG. 12 shows example control circuitry 1200 that may be provided according to one or more embodiments for controlling the switches 440 and 450 of the adjustable transmission lines and for controlling the adjustable capacitors. The control circuitry 1200 may be co-located with the splitter/combiner 100, e.g., in the same die, device, or assembly, or it may be disposed in a different die, device, or assembly. The control circuitry 1200 may be dedicated for use with the splitter/combiner 100, or it may be arranged for more general-purpose use.

The control circuitry 1200 includes a processing unit 1210, such as a CPU (central processing unit) microcontroller, or other processor, and memory 1220, which may include both volatile memory and non-volatile memory. The memory 1220 stores one or more programs 1230 and a configuration utility 1240.

The configuration utility 1240 is constructed and arranged to identify capacitor settings for adjustable capacitors 160, 170, 180, 1030, 1040, 1070, and/or 1080, based on desired values of capacitance. The configuration utility 1240 is further constructed and arranged to identify switch settings (e.g., open or closed) for shunt switches 240 and series switches 250 of the adjustable transmission lines 140, 150, 1020, and/or 1060, based on desired values of characteristic impedance and phase shift. The configuration utility 1240 is still further constructed and arranged to provide control signals 1242 for establishing the identified capacitor settings and transmission-line switch settings in the adjustable capacitors and transmission lines.

For example, the configuration utility 1240 includes a first data structure 1250, which associates desired capacitor values 1252 of an adjustable capacitor with associated capacitor switch settings 1254 (for switches 240 in the embodiment of FIG. 2A) or bias voltages 1256 (for the diode 280 in the embodiment of FIG. 2*b*). Given a desired capacitance value, the first data structure 1250 identifies associated settings 1254 or 1256 for establishing that desired capacitance value.

In an example, the configuration utility 1240 further includes a second data structure 1260, which associates desired characteristic impedances 1262 and associated phase shifts 1264 of an adjustable transmission line with sets of switch settings 1266 which, if configured in the adjustable transmission line, would cause the adjustable transmission line to assume the desired characteristic impedances and phase shifts. The specified characteristic impedances 1262 and phase shifts 1264 for given sets of switch settings 1266 may be determined based on actual measurements or simulations, for example.

FIGS. 13-18 show various configurations of the splitter/combiner 100 that may be established for controlling power division between the second port 120 and the third port 130 and for controlling phase difference between the second port 120 and the third port 130. The depicted examples assume that the capacitors 160 and 170 are both adjustable and that the transmission lines 140 and 150 are both adjustable. However, many configurations may still be achieved with embodiments that have fewer adjustable capacitors or adjustable transmission lines.

In an example, the depicted configurations are established by operation of the control circuitry 1200 (FIG. 12), which sets desired capacitance values of the adjustable capacitors 160 and 170 and desired characteristic impedances and phase shifts of the transmission lines 140 and 150. In the examples shown in FIGS. 13-18, capacitor 180 is assumed to have a fixed capacitance of 6.2 pF (picofarads) and the isolation resistor 190 is assumed to have a fixed resistance of 20 ohms. However, both the capacitor 180 and the resistor 190 may be adjustable in one or more embodiments and may have different values besides those shown. The examples are merely for illustration.

Figure 13:
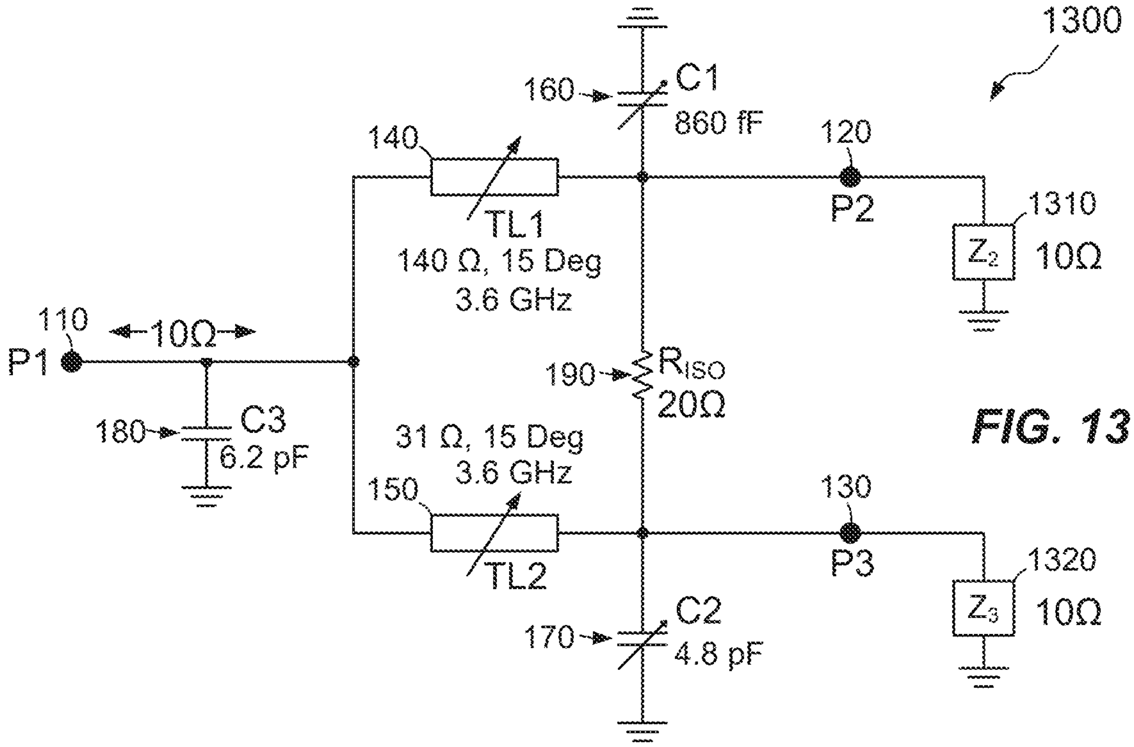
FIG. 13 is a schematic diagram of an example splitter/combiner arranged to supply output signals having different power levels to the second and third ports while maintaining zero or nearly zero phase difference between the output signals and without adjusting load impedances, according to one or more embodiments.

FIG. 13 is a schematic view of an example configuration 1300 of the splitter/combiner 100 according to one or more embodiments. Here, the splitter/combiner 100 is configured to divide power unequally between ports 120 and 130 to respective loads 1310 ($Z_2$) and 1320 ($Z_3$), with port 130 providing 6 dB more power than port 120. Both loads 1310 and 1320 in this example have impedances of 10 ohms. A zero or nearly zero-degree phase difference appears between the ports 120 and 130.

The configuration 1300 is achieved by setting capacitor 160 to 860 fF and capacitor 170 to 4.8 pF, by setting the first transmission line 140 to a 140-ohm characteristic impedance at a 15-degree phase shift (at a 3.6-gigahertz design frequency), and by setting the second transmission line 140 to a 31-ohm characteristic impedance at a 15-degree phase shift.

One should appreciate that different power divisions may be established while keeping phase difference between ports 120 and 130 constant. In general, larger power divisions are established by increasing the characteristic impedance of transmission line 140 and decreasing the characteristic impedance of transmission line 150. Conversely, smaller power divisions are established by decreasing the characteristic impedance of transmission line 140 and increasing the characteristic impedance of transmission line 150.

Figure 14:
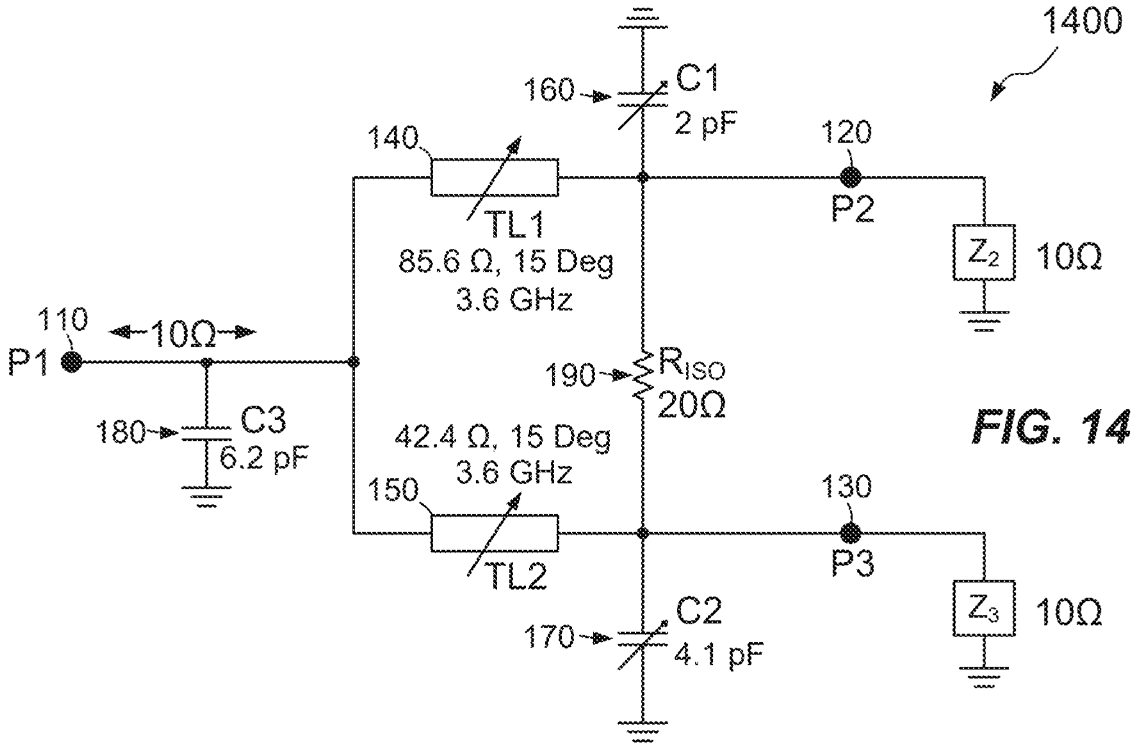
FIG. 14 is a schematic diagram of the example splitter/combiner arranged to supply output signals having different power levels to the second and third ports while maintaining zero or nearly zero phase difference between the output signals and without adjusting load impedances, according to one or more embodiments.

FIG. 14 shows an example configuration 1400 of the splitter/combiner 100 arranged for producing a 3-dB power division with the same zero or nearly zero degrees of phase difference between ports 120 and 130, according to one or more embodiments. The configuration 1400 is established by changing the characteristic impedance of transmission line 140 to 85.6 ohms and changing the characteristic impedance of transmission line 150 to 42.4 ohms. In addition, the capacitor 160 is changed to 2 pF and the capacitor 170 is changed to 4.1 pF. Other settings are kept the same.

Although the configurations 1300 and 1400 achieve unequal power division at ports 120 and 130 while keeping phase difference constant, it has been observed that higher imbalances in power division tend to degrade certain characteristics, such as return loss and isolation between ports 120 and 130.

Figure 15:
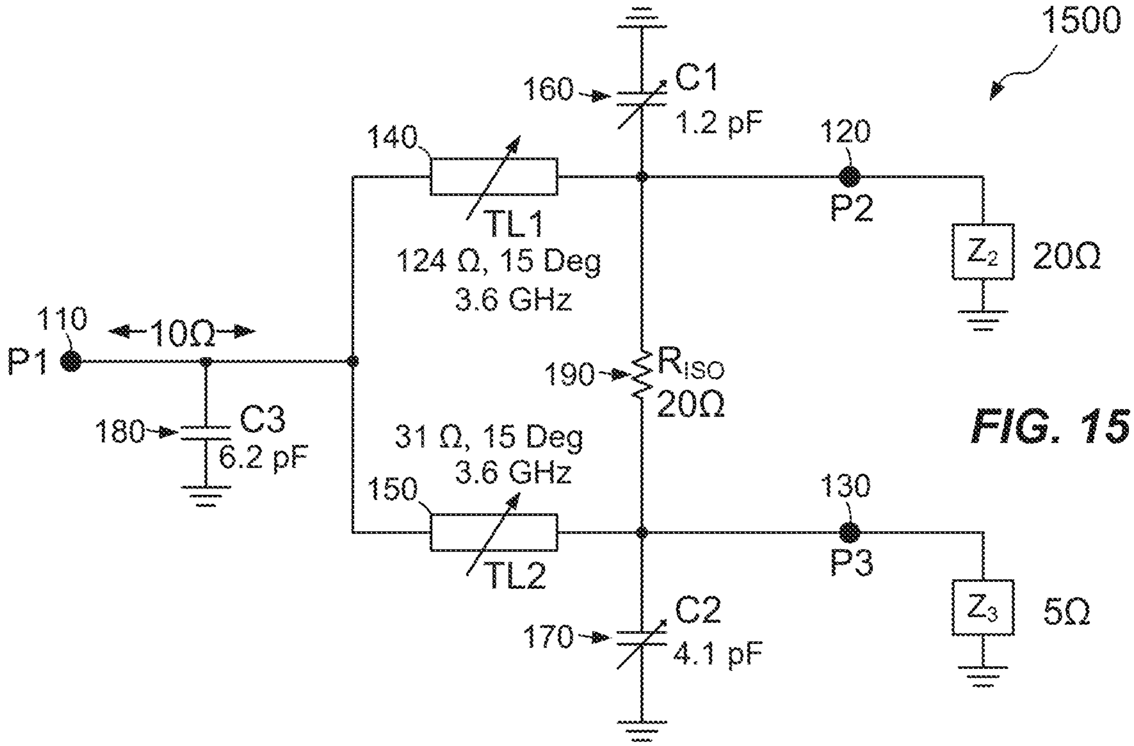
FIG. 15 is a schematic diagram of an example splitter/combiner arranged to supply output signals having different power levels to the second and third ports while maintaining zero or nearly zero phase difference between the output signals and after adjusting load impedances, according to one or more embodiments.

FIG. 15 is a schematic view of an example configuration 1500 of the splitter/combiner 100 according to one or more embodiments. As with configuration 1300 of FIG. 13, the configuration 1500 also provides 6-dB of power difference with zero or nearly zero degrees of phase difference between ports 120 and 130. Here, however, the loads have been adjusted, with the load impedance at port 120 set to 20 ohms and the load impedance at port 130 set to 5 ohms. Other changes relative to FIG. 13 include changing the characteristic impedance of transmission line 140 to 124 ohms, changing the capacitance of capacitor 160 to 1.2 pF, and changing the capacitance of capacitor 170 to 4.1 pF. With the loads adjusted and other changes made, return loss and isolation are restored to baseline levels, or nearly to baseline levels, thus showing that high performance can still be maintained even at a 6 dB power imbalance, assuming the load impedances can be adjusted. One should appreciate that load impedance adjustments can be made in a variety of ways, such as by using one or more IMNs (FIG. 10) or other selectable impedances.

Figure 16:
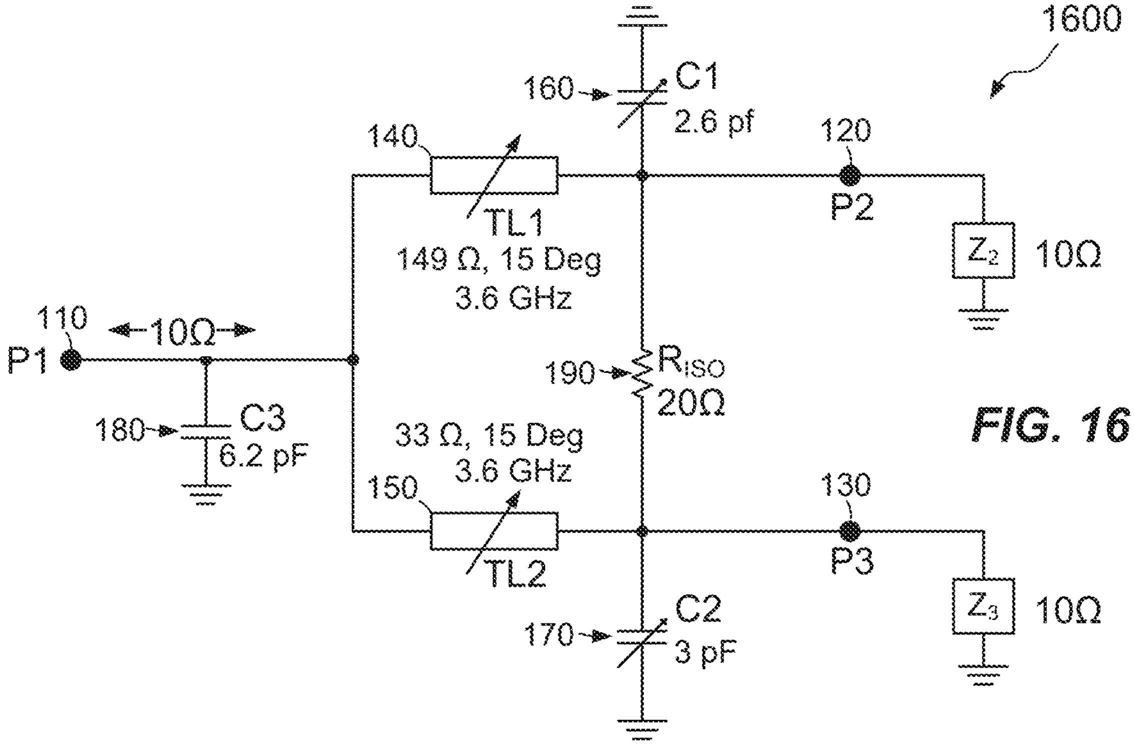
FIG. 16 is a schematic diagram of an example splitter/combiner arranged to supply output signals having equal power levels to the second and third ports while providing a non-zero phase shift between the output signals at the second and third ports and without adjusting load impedances, according to one or more embodiments.

FIG. 16 is a schematic view of yet another example configuration 1600 of the splitter/combiner 100 according to one or more embodiments. In this example, power division between ports 120 and 130 is unequal (6 dB) but phase difference between ports 120 and 130 is nonzero, i.e. 20 degrees in the example shown. The load impedances at ports 120 and 130 are each 10 ohms. The settings for transmission lines 140 and 150 and for capacitors 160 and 170 are as indicated in the figure. As before, large differences in power delivered by ports 120 and 130 tends to degrade return loss and isolation, but these factors can be improved by adjusting the impedance of one or more of the loads.

Figure 17:
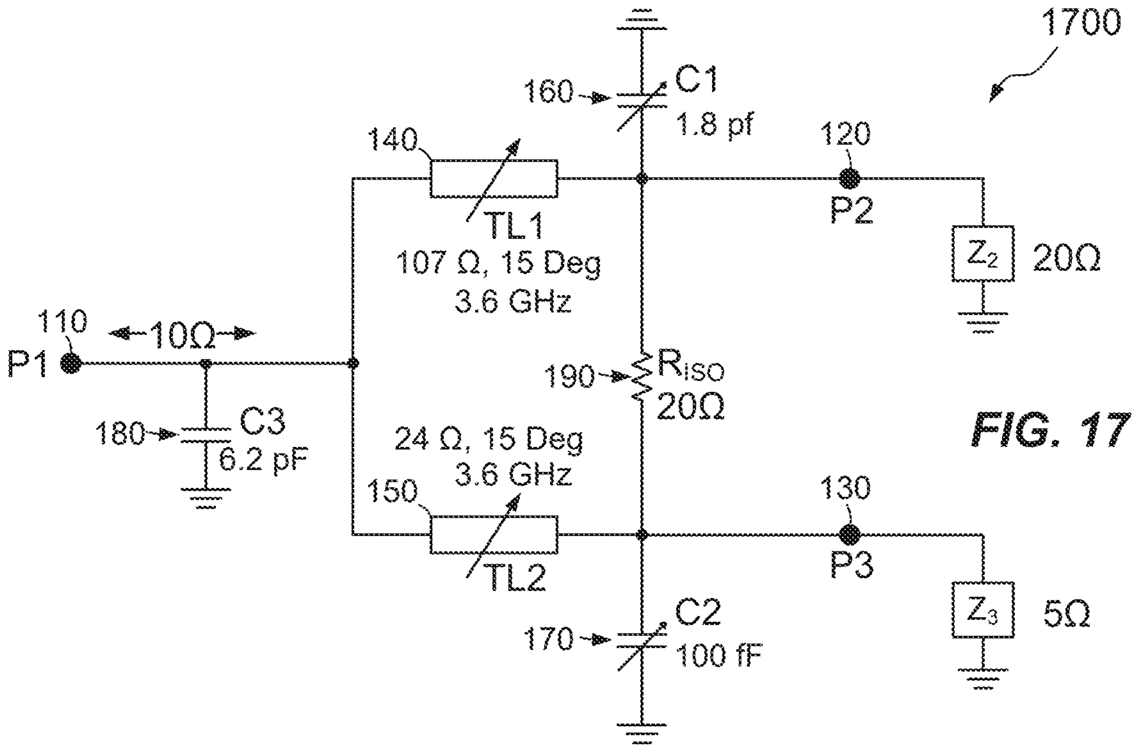
FIG. 17 is a schematic diagram of an example splitter/combiner arranged to supply output signals having equal power levels to the second and third ports while providing a non-zero phase shift between the output signals at the second and third ports and after adjusting load impedances, according to one or more embodiments.

FIG. 17 is a schematic view of another example configuration 1700 of the splitter/combiner 100 according to one or more embodiments. As with FIG. 16, power division between ports 120 and 130 is 6 dB and phase difference between ports 120 and 130 is 20-degrees. Unlike the FIG. 16 example, however, the load impedances in this example are adjusted, with the load impedance at port 120 set to 20 ohms and the load impedance at port 130 set to 5 ohms. Other changes are as indicated in the figure. With the load impedances adjusted and other changes made, return loss and isolation are restored to baseline levels, or nearly so, thus demonstrating that high performance can still be maintained even at a 6 dB power imbalance and a 20-degree phase difference.

Figure 18:
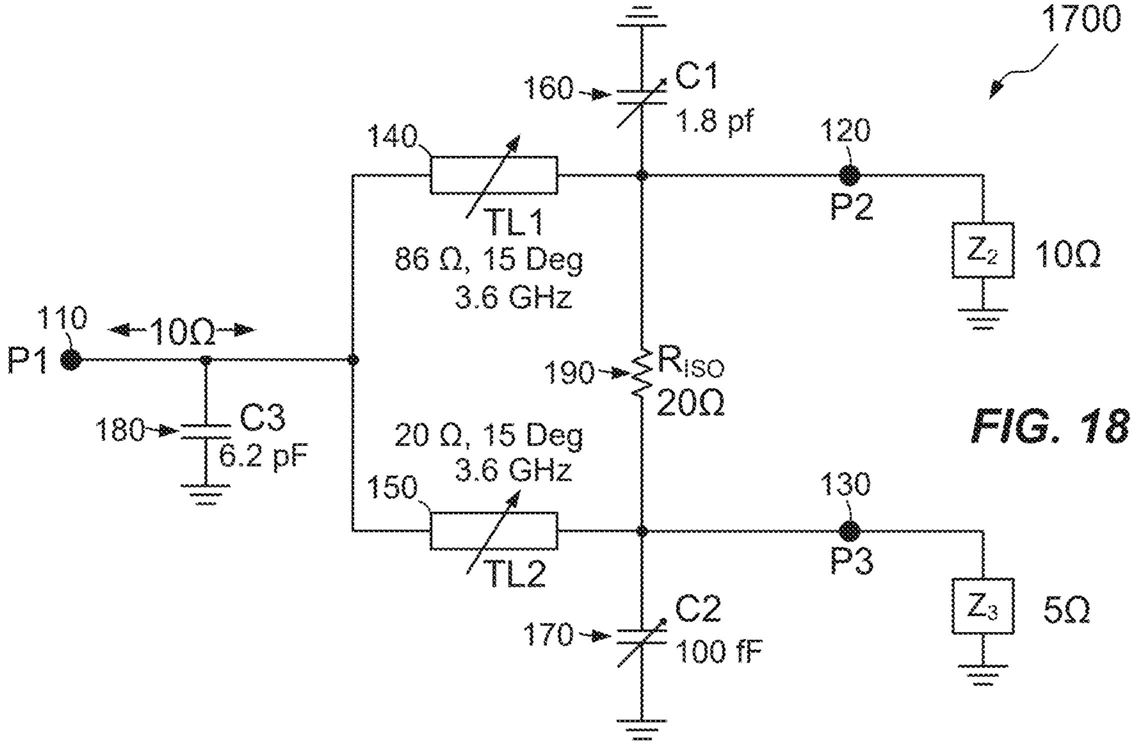
FIG. 18 is a schematic diagram of an example splitter/combiner arranged to supply output signals having equal power levels to the second and third ports while providing a non-zero phase shift between the output signals at the second and third ports and after adjusting only one load impedance, according to one or more embodiments.

FIG. 18 is a schematic view of a still further example configuration 1800 of the splitter/combiner 100 according to one or more embodiments. The FIG. 18 example is similar to the FIG. 17 example, except that the load impedance at port 130 is adjusted to 5 ohms, with the load impedance at port 120 remaining at 10 ohms, as it is in FIG. 16. Thus, only one load impedance is adjusted. Other settings are as indicated in the figure. Although only one load impedance is adjusted, significant improvements are still achieved in return loss and isolation. The improvements may not be as great as they are when both load impedances are adjusted, but they still may be sufficient for many applications.

Figure 19:
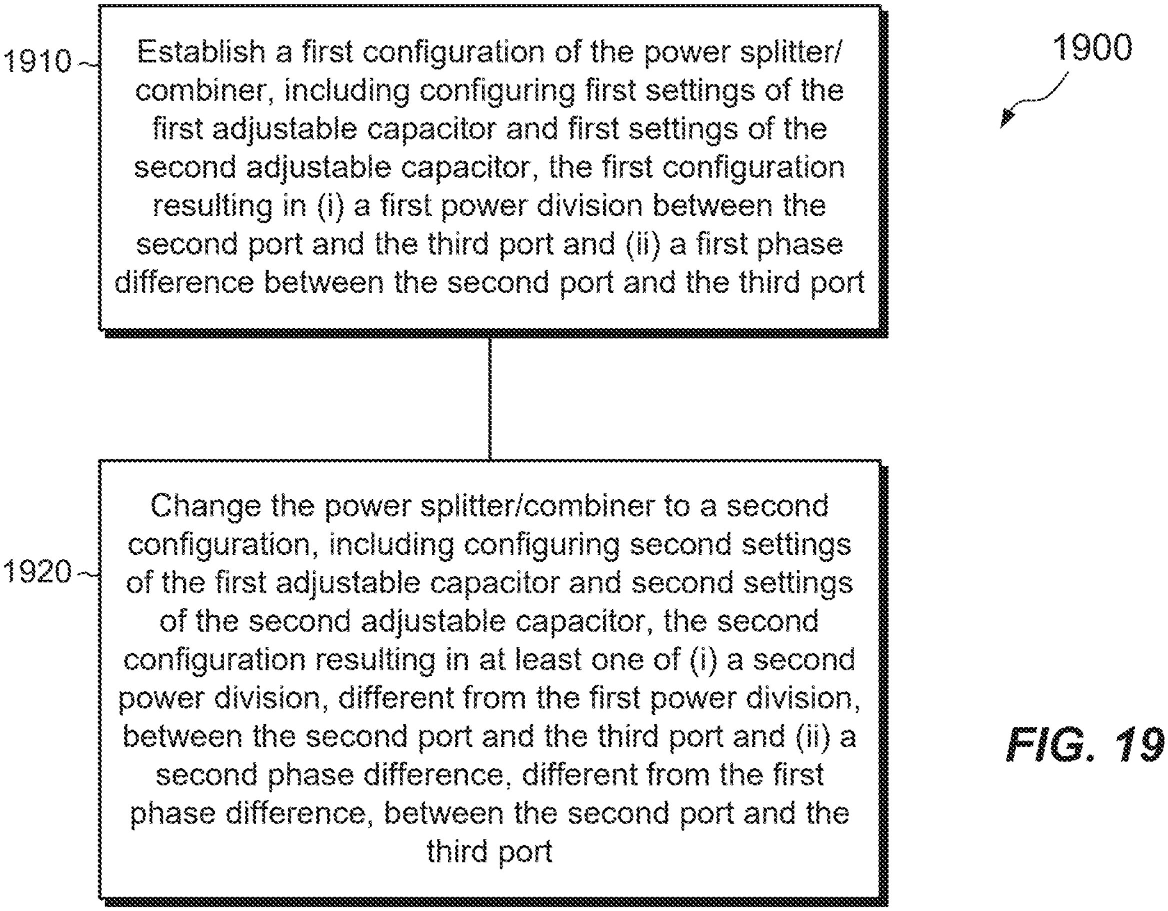
FIG. 19 is a flowchart showing an example method of operating a splitter/combiner according to one or more embodiments.

FIG. 19 shows an example method 1900 that may be carried out in connection with the splitter/combiner 100 according to one or more embodiments. The method 1900 is typically performed, for example, by the control circuitry 1200 of FIG. 12 acting upon the splitter/combiner 100 of FIG. 1. The various acts of method 1900 may be ordered in any suitable way.

At 1910, the control circuitry 1200 establishes a first configuration of the splitter/combiner 100, which includes configuring first settings (e.g., 1254 or 1256) of the first adjustable capacitor 160 and first settings (e.g., 1254 or 1256) of the second adjustable capacitor 170. The first configuration results in (i) a first power division between the second port 120 and the third port 130 (e.g., 0 dB, 3 dB, 6 dB, etc.) and (ii) a first phase difference between the second port 120 and the third port 130 (e.g., 0 degrees, 20 degrees, etc.).

At 1920, the control circuitry 1200 establishes a second configuration of the splitter/combiner 100, which includes configuring second settings (e.g., 1254 or 1256) of the first adjustable capacitor 160 and second settings (e.g., 1254 or 1256) of the second adjustable capacitor 170. The second configuration results in at least one of (i) a second power division, different from the first power division, between the second port 120 and the third port 130 and (ii) a second phase difference, different from the first phase difference, between the second port 120 and the third port 130.

One example of the first configuration may be the one shown in FIG. 13, where a 6-dB power difference appears between ports 120 and 130 with zero degrees of phase difference appearing between these ports. The first settings of the transmission lines 140 and 150 and the first settings of the capacitors 160 and 170 establish these characteristics.

One example of the second configuration may be the one shown in FIG. 14, in which the power difference is 3 dB, rather than 6 dB, and the phase difference is still zero degrees. The second settings of the transmission lines 140 and 150 and adjustable capacitors 160 and 170 establish these characteristics. Another example of the second configuration is that shown in FIG. 16, where the power division between ports 120 and 130 is 6 dB but the phase difference between ports 120 and 130 is 20 degrees. Thus, the second configuration may provide a different power division and/or a different phase difference from the ones provided by the first configuration.

One should appreciate that independent control over transmission lines 140 and 150, e.g., for both characteristic impedance and phase shift, as well as independent control over capacitors 160 and 170, provides a great deal of flexibility in establishing a wide range of power and phase differences between ports 120 and 130. In addition, the above-described examples show that power difference and phase difference can be adjusted orthogonally to each other, such that either power difference or phase difference can be held constant while the other is varied. Of course, both power difference and phase difference can be varied at the same time.

According to one or more embodiments, changing the splitter/combiner 100 from the first configuration to the second configuration may involve changing the load impedances coupled to the second and third ports. For example, both load impedances may be adjusted (FIGS. 15 and 17), or just a single load impedance may be adjusted (FIG. 18).

An improved technique has been described for splitting or combining electrical signals. The technique includes providing a splitter/combiner 100 having first, second, and third ports (110, 120, and 130, respectively). A first transmission line 140 is electrically coupled between the first and second ports, and a second transmission line 150 is electrically coupled between the first and third ports. A first capacitor 160 is electrically coupled between the second port and a common node, and a second capacitor 170 is electrically coupled between the third port and the common node. During operation, at least one of the first capacitor, second capacitor, first transmission line, and second transmission line is adjustable for varying the electrical properties of the splitter/combiner. Advantageously, the improved technique allows a splitter/combiner to be adjusted in place during operation, enabling tuning of its characteristics for achieving impedance matching and phase control and enabling the same adjustable design to be replicated across many different applications.

Certain embodiments are directed to a power splitter/combiner having a first port, a second port, and a third port. The power splitter/combiner includes first and second transmission lines. The first transmission line has a first terminal coupled to the first port and a second terminal coupled to the second port. The second transmission line has a first terminal coupled to the first port and a second terminal coupled to the third port. At least one of the first and second transmission lines has a characteristic impedance and a phase shift that are adjustable during operation. The power splitter/combiner further includes first and second capacitors each having a first terminal and a second terminal. The first terminal of the first capacitor is coupled to the second port, the first terminal of the second capacitor is coupled to the third port, the second terminal of each of the first and second capacitors is coupled to a common node, and at least one of the first and second capacitors has a capacitance value that is adjustable during operation. The power splitter/combiner still further includes a resistor having a first terminal coupled to the second port and a second terminal coupled to the third port.

According to one or more further embodiments, the power splitter/combiner further includes a third capacitor having a first terminal coupled to the first port and a second terminal coupled to the common node.

According to one or more further embodiments, the first capacitor is adjustable during operation and includes at least one of (i) a first plurality of switchable capacitor elements that are arranged to selectively electrically couple together in multiple arrangements or (ii) a first diode. Also, the second capacitor is adjustable during operation and includes at least one of (i) a second plurality of switchable capacitor elements that are arranged to selectively electrically couple together in multiple arrangements or (ii) a second diode.

According to one or more further embodiments, the first transmission line includes a first plurality of shield elements that are individually switchable to the common node during operation to establish multiple values of characteristic impedance and multiple values of phase shift of the first transmission line. Also, the second transmission line includes a second plurality of shield elements that are individually switchable to the common node during operation to establish multiple values of characteristic impedance and multiple values of phase shift of the second transmission line.

According to one or more further embodiments, the first transmission line includes a transmission structure having a central trace and a first pair of lateral traces that run parallel to the central trace and a shield structure disposed below the transmission structure. The shield structure includes the first plurality of shield elements and a second pair of lateral traces. The first plurality of shield elements extends in a line below the central trace and between the second pair of lateral traces. The first pair of lateral traces and the second pair of lateral traces are coupled to the common node.

According to one or more further embodiments, at least two shield elements of the first plurality of shield elements are arranged to selectively connect together.

According to one or more further embodiments, at least one of the first transmission line and the second transmission line is adjustable to establish multiple different values of characteristic impedance at a common value of phase shift.

According to one or more further embodiments, at least one of the first transmission line and the second transmission line is adjustable to establish multiple different values of phase shift at a common value of characteristic impedance.

Additional embodiments are directed to a power splitter/combiner having a first port, a second port, and a third port. The power splitter/combiner includes first and second transmission lines. The first transmission line has a first terminal coupled to the first port and a second terminal coupled to the second port. The second transmission line has a first terminal coupled to the first port and a second terminal coupled to the third port. The power splitter/combiner further includes first and second capacitors each having a first terminal and a second terminal. The first terminal of the first capacitor is coupled to the second port, the first terminal of the second capacitor is coupled to the third port, the second terminal of each of the first and second capacitors is coupled to a common node, and at least one of the first and second capacitors has a capacitance value that is adjustable during operation. The power splitter/combiner still further includes a resistor having a first terminal coupled to the second port and a second terminal coupled to the third port.

According to one or more further embodiments, the power splitter/combiner further includes a third capacitor having a first terminal coupled to the first port and a second terminal coupled to the common node.

According to one or more further embodiments, the first capacitor is adjustable during operation and includes at least one of (i) a first plurality of switchable capacitor elements that are arranged to selectively electrically couple together in multiple arrangements or (ii) a first diode. In addition, the second capacitor is adjustable during operation and includes at least one of (i) a second plurality of switchable capacitor elements that are arranged to selectively electrically couple together in multiple arrangements or (ii) a second diode.

Still further embodiments are directed to a device that includes a semiconductor die in which a power splitter/combiner is formed. The power splitter/combiner has a first port, a second port, and a third port and includes first and second transmission lines. The first transmission line has a first terminal coupled to the first port and a second terminal coupled to the second port. The second transmission line has a first terminal coupled to the first port and a second terminal coupled to the third port. At least one of the first and second transmission lines has a characteristic impedance and a phase shift that are adjustable during operation. The power splitter/combiner further includes first and second capacitors each having a first terminal and a second terminal. The first terminal of the first capacitor is coupled to the second port, the first terminal of the second capacitor is coupled to the third port, and the second terminal of each of the first and second capacitors is coupled to a common node. The power splitter/combiner still further includes a resistor having a first terminal coupled to the second port and a second terminal coupled to the third port.

According to one or more further embodiments, the first transmission line includes a first plurality of shield elements that are individually switchable to the common node during operation to establish multiple values of characteristic impedance and multiple values of phase shift of the first transmission line. Also, the second transmission line includes a second plurality of shield elements that are individually switchable to the common node during operation to establish multiple values of characteristic impedance and multiple values of phase shift of the second transmission line.

According to one or more further embodiments, the first transmission line includes a transmission structure having a central trace and a pair of lateral traces that run parallel to the central trace and a shield structure disposed below the transmission structure. The shield structure includes the first plurality of shield elements. The first plurality of shield elements extends in a line below the central trace. The pair of lateral traces is coupled to the common node.

According to one or more further embodiments, at least two shield elements of the first plurality of shield elements are arranged to selectively connect together.

According to one or more further embodiments, at least one of the first transmission line and the second transmission line is adjustable to establish multiple different values of characteristic impedance at a common value of phase shift.

According to one or more further embodiments, at least one of the first transmission line and the second transmission line is adjustable to establish multiple different values of phase shift at a common value of characteristic impedance.

According to one or more further embodiments, the device further includes a tunable IMN (impedance matching network) coupled to the second port. The tunable IMN includes a third transmission line having a first terminal coupled to the second port and a second terminal coupled to a load and an adjustable capacitor coupled between the second terminal of the third transmission line and the common node. The third transmission line includes a third plurality of shield elements that are individually switchable to the common node during operation to establish multiple values of characteristic impedance and multiple values of phase shift of the third transmission line.

According to one or more further embodiments, the tunable IMN is a first tunable IMN, and the device further comprises a second tunable IMN coupled to the third port. The second tunable IMN includes a fourth transmission line having a first terminal and second terminal. The first terminal of the fourth transmission line is coupled to the third port, and the second terminal of the fourth transmission line coupled to a second load. The second tunable IMN further includes a second adjustable capacitor coupled between the second terminal of the fourth transmission line and the common node.

According to one or more further embodiments, the device further includes a carrier amplifier having an input terminal coupled to the second port of the power splitter/combiner, a phase shifter having a first terminal and a second terminal, the first terminal of the phase shifter coupled to the third port of the power splitter/combiner, and a peaking amplifier having an input terminal coupled to the output terminal of the phase shifter. The power splitter/combiner, the carrier amplifier, the peaking amplifier, and the phase shifter are parts of a Doherty amplifier. The phase shifter includes a fifth transmission line having a first terminal that provides the first terminal of the phase shifter and a second terminal that provides the second terminal of the phase shifter, and an adjustable capacitor coupled between the second terminal of the phase shifter and the common node. The fifth transmission line includes a fifth plurality of shield elements that are individually switchable to the common node during operation to establish multiple values of phase shift of the fifth transmission line.

Having described certain embodiments, numerous alternative embodiments or variations can be made. For example, although the illustrated embodiments show splitter/combiner circuits having three ports, one should appreciate that other embodiments may have greater than three ports. For example, a power splitter can have an input port and two or more output ports. In such arrangements, each output port has its own respective adjustable transmission line (like 140 or 150) and its own respective adjustable capacitor (like 160 or 170). The disclosure should therefore be interpreted as applying to any splitter/combiner having three or more ports.

Further, although features have been shown and described with reference to particular embodiments hereof, such features may be included and hereby are included in any of the disclosed embodiments and their variants. Thus, it is understood that features disclosed in connection with any embodiment are included in any other embodiment.

As used throughout this document, the words "comprising," "including," "containing," and "having" are intended to set forth certain items, steps, elements, or aspects of something in an open-ended fashion. Also, as used herein and unless a specific statement is made to the contrary, the word "set" means one or more of something. This is the case regardless of whether the phrase "set of" is followed by a singular or plural object and regardless of whether it is conjugated with a singular or plural verb. Also, a "set of" elements can describe fewer than all elements present. Thus, there may be additional elements of the same kind that are not part of the set. Further, ordinal expressions, such as "first," "second," "third," and so on, may be used as adjectives herein for identification purposes. Unless specifically indicated, these ordinal expressions are not intended to imply any ordering or sequence. Thus, for example, a "second" event may take place before or after a "first event," or even if no first event ever occurs. In addition, an identification herein of a particular element, feature, or act as being a "first" such element, feature, or act should not be construed as requiring that there must also be a "second" or other such element, feature or act. Rather, the "first" item may be the only one. Also, and unless specifically stated to the contrary, "based on" is intended to be nonexclusive. Thus, "based on" should be interpreted as meaning "based at least in part on" unless specifically indicated otherwise. Further, although the term "user" as used herein may refer to a human being, the term is also intended to cover non-human entities, such as robots, bots, and other computer-implemented programs and technologies. Although certain embodiments are disclosed herein, it is understood that these are provided by way of example only and should not be construed as limiting.

Also, the foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematics and component features shown in the figures depict one exemplary arrangement of elements, additional intervening elements, devices, features, or components may be present in one or more other embodiments of the depicted subject matter.

Those skilled in the art will therefore understand that various changes in form and detail may be made to the embodiments disclosed herein without departing from the scope of the following claims.

What is claimed is:

1. A power splitter/combiner having a first port, a second port, and a third port, comprising:

first and second transmission lines, the first transmission line having a first terminal coupled to the first port and a second terminal coupled to the second port, the second transmission line having a first terminal coupled to the first port and a second terminal coupled to the third port, wherein the first transmission line has a characteristic impedance and a phase shift that are adjustable during operation, and the first transmission line includes:

a transmission structure having a central trace, a shield structure that includes a first plurality of shield elements, including first and second shield elements, extending in a line below the central trace, a first series switch arranged to selectively electrically couple the first and second shield elements together, and a first shunt switch arranged to selectively electrically couple the first shield element to a common node;

first and second capacitors each having a first terminal and a second terminal, the first terminal of the first capacitor coupled to the second port, the first terminal of the second capacitor coupled to the third port, the second terminal of each of the first and second capacitors coupled to the common node, and at least one of the first and second capacitors having a capacitance value that is adjustable during operation; and a resistor having a first terminal coupled to the second port and a second terminal coupled to the third port.

2. The power splitter/combiner of claim 1, further comprising a third capacitor having a first terminal coupled to the first port and a second terminal coupled to the common node.

3. The power splitter/combiner of claim 1, wherein the first capacitor is adjustable during operation and includes at least one of (i) a first plurality of switchable capacitor elements that are arranged to selectively electrically couple together in multiple arrangements or (ii) a first diode, and wherein the second capacitor is adjustable during operation and includes at least one of (i) a second plurality of switchable capacitor elements that are arranged to selectively electrically couple together in multiple arrangements or (ii) a second diode.

4. The power splitter/combiner of claim 3, wherein the first and second shield elements of the first transmission line are individually switchable to the common node during operation to establish multiple values of characteristic impedance and multiple values of phase shift of the first transmission line, and wherein the second transmission line includes a second plurality of shield elements that are individually switchable to the common node during operation to establish multiple values of characteristic impedance and multiple values of phase shift of the second transmission line.

5. The power splitter/combiner of claim 4, wherein:

the transmission structure further includes a first pair of lateral traces that run parallel to the central trace; and the shield structure further includes a second pair of lateral traces, the first and second shield elements extending between the second pair of lateral traces, wherein the first pair of lateral traces and the second pair of lateral traces are coupled to the common node.

6. The power splitter/combiner of claim 4, wherein at least one of the first transmission line and the second transmission line is adjustable to establish multiple different values of phase shift at a common value of characteristic impedance.

7. The power splitter/combiner of claim 4, wherein at least one of the first transmission line and the second transmission line is adjustable to establish multiple different values of characteristic impedance at a common value of phase shift.

8. The power splitter/combiner of claim 1, wherein:

the first plurality of shield elements further includes additional shield elements extending in the line below the central trace; and the first transmission line further includes additional series switches arranged to selectively electrically couple adjacent ones of the additional shield elements together, and additional shunt switches arranged to selectively electrically couple the additional shield elements to the common node.

9. A power splitter/combiner having a first port, a second port, and a third port, comprising:

first and second transmission lines, the first transmission line having a first terminal coupled to the first port and a second terminal coupled to the second port, the second transmission line having a first terminal coupled to the first port and a second terminal coupled to the third port, wherein the first transmission line includes:

a transmission structure having a central trace, a shield structure that includes a first plurality of shield elements, including first and second shield elements, extending in a line below the central trace, a first series switch arranged to selectively electrically couple the first and second shield elements together, and a first shunt switch arranged to selectively electrically couple the first shield element to a common node;

first and second capacitors each having a first terminal and a second terminal, the first terminal of the first capacitor coupled to the second port, the first terminal of the second capacitor coupled to the third port, the second terminal of each of the first and second capacitors coupled to the common node, and at least one of the first and second capacitors having a capacitance value that is adjustable during operation; and a resistor having a first terminal coupled to the second port and a second terminal coupled to the third port.

10. The power splitter/combiner of claim 9, further comprising a third capacitor having a first terminal coupled to the first port and a second terminal coupled to the common node.

11. The power splitter/combiner of claim 9, wherein the first capacitor is adjustable during operation and includes at least one of (i) a first plurality of switchable capacitor elements that are arranged to selectively electrically couple together in multiple arrangements or (ii) a first diode, and wherein the second capacitor is adjustable during operation and includes at least one of (i) a second plurality of switchable capacitor elements that are arranged to selectively electrically couple together in multiple arrangements or (ii) a second diode.

12. A device, comprising a semiconductor die in which a power splitter/combiner is formed, the power splitter/combiner having a first port, a second port, and a third port and including:

first and second transmission lines, the first transmission line having a first terminal coupled to the first port and a second terminal coupled to the second port, the second transmission line having a first terminal coupled to the first port and a second terminal coupled to the third port, wherein the first transmission line has a characteristic impedance and a phase shift that are adjustable during operation, and the first transmission line includes:

a transmission structure having a central trace, a shield structure that includes a first plurality of shield elements, including first and second shield elements, extending in a line below the central trace, a first series switch arranged to selectively electrically couple the first and second shield elements together, and a first shunt switch arranged to selectively electrically couple the first shield element to a common node;

first and second capacitors each having a first terminal and a second terminal, the first terminal of the first capacitor coupled to the second port, the first terminal of the second capacitor coupled to the third port, and the second terminal of each of the first and second capacitors coupled to a common node; and a resistor having a first terminal coupled to the second port and a second terminal coupled to the third port.

13. The device of claim 12, wherein the first and second shield elements of the first transmission line are individually switchable to the common node during operation to establish multiple values of characteristic impedance and multiple values of phase shift of the first transmission line, and wherein the second transmission line includes a second plurality of shield elements that are individually switchable to the common node during operation to establish multiple values of characteristic impedance and multiple values of phase shift of the second transmission line.

14. The device of claim 13, wherein:

the transmission structure further includes a pair of lateral traces that run parallel to the central trace;

the first and second shield elements extend in a line below the central trace; and the pair of lateral traces is coupled to the common node.

15. The device of claim 13, wherein at least one of the first transmission line and the second transmission line is adjustable to establish multiple different values of phase shift at a common value of characteristic impedance.

16. The device of claim 13, wherein at least one of the first transmission line and the second transmission line is adjustable to establish multiple different values of characteristic impedance at a common value of phase shift.

17. The device of claim 12, further comprising:

a carrier amplifier having an input terminal coupled to the second port of the power splitter/combiner;

a phase shifter having a first terminal and a second terminal, the first terminal of the phase shifter coupled to the third port of the power splitter/combiner; and a peaking amplifier having an input terminal coupled to the output terminal of the phase shifter, wherein the power splitter/combiner, the carrier amplifier, the peaking amplifier, and the phase shifter are parts of a Doherty amplifier, and wherein the phase shifter includes:

a fifth transmission line having a first terminal that provides the first terminal of the phase shifter and a second terminal that provides the second terminal of the phase shifter; and an adjustable capacitor coupled between the second terminal of the phase shifter and the common node, wherein the fifth transmission line includes a fifth plurality of shield elements that are individually switchable to the common node during operation to establish multiple values of phase shift of the fifth transmission line.

18. The device of claim 12, further comprising a tunable IMN (impedance matching network) coupled to the second port, the tunable IMN including:

a third transmission line having a first terminal coupled to the second port and a second terminal coupled to a load; and an adjustable capacitor coupled between the second terminal of the third transmission line and the common node, wherein the third transmission line includes a third plurality of shield elements that are individually switchable to the common node during operation to establish multiple values of characteristic impedance and multiple values of phase shift of the third transmission line.

19. The device of claim 18, wherein the tunable IMN is a first tunable IMN, and wherein the device further comprises a second tunable IMN coupled to the third port, the second tunable IMN including:

a fourth transmission line having a first terminal and second terminal, the first terminal of the fourth transmission line coupled to the third port and the second terminal of the fourth transmission line coupled to a second load; and a second adjustable capacitor coupled between the second terminal of the fourth transmission line and the common node.

* * * * *